(12) United States Patent
Soler Castany et al.

(10) Patent No.: US 7,791,539 B2
(45) Date of Patent: *Sep. 7, 2010

(54) RADIO-FREQUENCY SYSTEM IN PACKAGE INCLUDING ANTENNA

(75) Inventors: Jordi Soler Castany, Mataró (ES); Jaume Anguera Pros, Vinaròs (ES); Carles Puente Baliarda, Barcelona (ES); Carmen Borja Borau, Barcelona (ES); José Mumbru Forn, Barcelona (ES)

(73) Assignee: Fractus, S.A., Barcelona (ES)

( * ) Notice: Subject to any disclaimer, the term of this patent is extended or adjusted under 35 U.S.C. 154(b) by 978 days.

This patent is subject to a terminal disclaimer.

(21) Appl. No.: 11/556,455

(22) Filed: Nov. 3, 2006

(65) Prior Publication Data

US 2007/0120742 A1 May 31, 2007

Related U.S. Application Data

(63) Continuation of application No. PCT/EP2004/004851, filed on May 6, 2004, and a continuation-in-part of application No. 11/488,107, filed on Jul. 17, 2006, now Pat. No. 7,463,199, which is a continuation of application No. 11/040,622, filed on Jan. 21, 2005, now Pat. No. 7,095,372, which is a continuation of application No. PCT/EP02/12427, filed on Nov. 7, 2002.

(51) Int. Cl.
*H01Q 1/38* (2006.01)
*H01Q 11/12* (2006.01)
*H01Q 13/10* (2006.01)
*H01Q 9/16* (2006.01)
*H01Q 1/36* (2006.01)

(52) U.S. Cl. .................. 343/700 MS; 343/741; 343/767; 343/793; 343/895

(58) Field of Classification Search .......... 343/700 MS, 343/702, 741, 793, 818, 876, 895
See application file for complete search history.

(56) References Cited

U.S. PATENT DOCUMENTS 2,780,808 A 2/1957 Middlemark (Continued)

FOREIGN PATENT DOCUMENTS

DE 19500925 7/1996

(Continued)

OTHER PUBLICATIONS

Breur, J.J., Bluetooth radio module with embedded antenna diversity, Proc. of European Conf. on Wireless Technology, Oct. 6-10, 2003, München.

(Continued)

*Primary Examiner*—Shih-Chao Chen
(74) *Attorney, Agent, or Firm*—Kenyon & Kenyon LLP

(57) ABSTRACT

A system comprising at least one antenna and a circuit, wherein the circuit is at least in part not a semiconductor chip or a die. The at least one antenna and the circuit are arranged on a package. Alternatively described is a system comprising at least one antenna and at least one circuit, wherein the at least one antenna and the at least one circuit are arranged on a package, wherein the at least one circuit performs a radio-frequency and optionally a base-band and/or a digital functionality.

52 Claims, 21 Drawing Sheets

U.S. PATENT DOCUMENTS

| | | | |
|---|---|---|---|
| 4,038,662 A * | 7/1977 | Turner | 343/752 |
| 4,232,277 A | 11/1980 | Dickens et al. | |
| 4,843,468 A | 6/1989 | Drewery | |
| 5,363,114 A | 11/1994 | Shoemaker | |
| 5,569,879 A | 10/1996 | Gloton | |
| 5,621,199 A | 4/1997 | Calari et al. | |
| 5,621,913 A | 4/1997 | Tuttle et al. | |
| 5,710,458 A | 1/1998 | Iwasaki | |
| 5,903,239 A | 5/1999 | Takahashi | |
| 6,011,518 A | 1/2000 | Yamagishi et al. | |
| 6,087,990 A | 7/2000 | Thill et al. | |
| 6,107,920 A | 8/2000 | Eberhardt et al. | |
| 6,147,655 A | 11/2000 | Roesner | |
| 6,236,366 B1 | 5/2001 | Yamamoto et al. | |
| 6,239,752 B1 | 5/2001 | Blanchard | |
| 6,240,301 B1 | 5/2001 | Phillips | |
| 6,263,193 B1 | 7/2001 | Iseki et al. | |
| 6,268,796 B1 | 7/2001 | Gnadinger et al. | |
| 6,281,848 B1 | 8/2001 | Naguno | |
| 6,285,342 B1 | 9/2001 | Brady et al. | |
| 6,320,543 B1 | 11/2001 | Ohata et al. | |
| 6,366,260 B1 | 4/2002 | Carrender | |
| 6,373,447 B1 * | 4/2002 | Rostoker et al. | 343/895 |
| 6,388,631 B1 | 5/2002 | Livingston et al. | |
| 6,421,013 B1 | 7/2002 | Chung | |
| 6,424,315 B1 | 7/2002 | Glenn et al. | |
| 6,509,825 B1 * | 1/2003 | Smit et al. | 340/5.2 |
| 6,563,463 B1 | 5/2003 | Saito | |
| 6,611,237 B2 | 8/2003 | Smith | |
| 6,646,609 B2 | 11/2003 | Yuasa et al. | |
| 6,670,921 B2 | 12/2003 | Sievenpiper et al. | |
| 6,697,021 B2 | 2/2004 | Shi | |
| 6,710,744 B2 | 3/2004 | Morris et al. | |
| 6,717,494 B2 | 4/2004 | Kikuchi et al. | |
| 6,744,411 B1 | 6/2004 | Osterhues et al. | |
| 6,745,945 B1 | 6/2004 | Limelette | |
| 6,819,293 B2 | 11/2004 | De Graauw | |
| 7,061,430 B2 * | 6/2006 | Zheng et al. | 343/700 MS |
| 7,095,372 B2 | 8/2006 | Soler Castany et al. | |
| 7,148,850 B2 * | 12/2006 | Puente Baliarda et al. | 343/700 MS |
| 7,463,199 B2 * | 12/2008 | Soler Castany et al. | 343/700 MS |
| 7,511,675 B2 | 3/2009 | Puente-Baliarda et al. | |
| 2001/0009507 A1 | 7/2001 | Washino et al. | |
| 2001/0046126 A1 | 11/2001 | Colello | |
| 2002/0005433 A1 | 1/2002 | Nochi et al. | |
| 2002/0058539 A1 | 5/2002 | Underbrink et al. | |
| 2002/0094661 A1 | 7/2002 | Enquist et al. | |
| 2003/0102544 A1 | 6/2003 | Nishikawa | |
| 2003/0201942 A1 | 10/2003 | Poilasne et al. | |
| 2004/0014428 A1 | 1/2004 | Franca-Neto | |
| 2004/0119644 A1 | 6/2004 | Puente-Baliarda et al. | |
| 2004/0129785 A1 | 7/2004 | Luu | |
| 2004/0129786 A1 | 7/2004 | Reignoux | |
| 2004/0145521 A1 | 7/2004 | Hebron et al. | |

FOREIGN PATENT DOCUMENTS

| | | |
|---|---|---|
| DE | 19500925 A1 | 7/1996 |
| EP | 0523564 | 1/1993 |
| EP | 0523564 A1 | 1/1993 |
| EP | 0902472 A2 | 3/1999 |
| EP | 0969375 | 1/2000 |
| EP | 0978729 A2 | 2/2000 |
| EP | 1085597 A2 | 3/2001 |
| EP | 1126522 A1 | 8/2001 |
| EP | 1227540 A1 | 7/2002 |
| EP | 1307078 A2 | 5/2003 |
| EP | 1326302 A3 | 7/2003 |
| EP | 00909089.5 B1 | 8/2005 |
| EP | 1130677 A2 | 9/2005 |
| ES | 2112163 | 3/1998 |
| FR | 2800245 | 5/2001 |
| JP | 62-262502 | 11/1987 |
| JP | 01-311605 | 12/1989 |
| JP | 1311605 A | 12/1989 |
| JP | 04-291502 | 10/1992 |
| JP | 05-347507 | 12/1993 |
| JP | 05347507 | 12/1993 |
| JP | 07-273685 | 10/1995 |
| JP | 07273685 | 10/1995 |
| JP | 08-052968 | 2/1996 |
| JP | 0856113 A | 2/1996 |
| JP | 09-069718 | 3/1997 |
| JP | 0983240 | 3/1997 |
| JP | 09069718 | 3/1997 |
| JP | 9083240 | 3/1997 |
| JP | 09-093029 | 4/1997 |
| JP | 09093029 | 4/1997 |
| JP | 93-21529 | 12/1997 |
| JP | 04291502 | 12/1997 |
| JP | 09321529 | 12/1997 |
| JP | 10261914 A | 9/1998 |
| JP | 11205024 A | 7/1999 |
| JP | 2000278009 A | 10/2000 |
| JP | 2001292026 A | 10/2001 |
| JP | 2001-7639 A | 12/2001 |
| JP | 2001-345745 | 12/2001 |
| JP | 2001345745 | 12/2001 |
| JP | 2002-064329 | 2/2002 |
| JP | 200250918 A | 2/2002 |
| JP | 2002064329 | 2/2002 |
| JP | 2002-158529 | 5/2002 |
| JP | 2002141726 A | 5/2002 |
| JP | 2002-190706 | 7/2002 |
| JP | 2002190706 | 7/2002 |
| JP | 2002-299933 | 10/2002 |
| JP | 2002-299935 | 10/2002 |
| JP | 2002299935 | 10/2002 |
| WO | 9706578 | 2/1997 |
| WO | 9927608 | 6/1999 |
| WO | 99/35691 | 7/1999 |
| WO | 9956347 A1 | 11/1999 |
| WO | 0025266 A1 | 5/2000 |
| WO | 0034916 A1 | 6/2000 |
| WO | 0036700 A1 | 6/2000 |
| WO | 0154225 A1 | 7/2000 |
| WO | 0077728 A1 | 12/2000 |
| WO | 01/05048 A1 | 1/2001 |
| WO | 0104957 A1 | 1/2001 |
| WO | 0108093 A1 | 2/2001 |
| WO | 01/22528 A1 | 3/2001 |
| WO | 01/54225 A1 | 7/2001 |
| WO | 0148861 A1 | 7/2001 |
| WO | 0201495 A1 | 1/2002 |
| WO | 0235646 A1 | 5/2002 |
| WO | 02/060004 A2 | 8/2002 |
| WO | 02/063714 A1 | 8/2002 |
| WO | 02060004 A2 | 8/2002 |
| WO | 02063714 A1 | 8/2002 |
| WO | 02/029929 A2 | 11/2002 |
| WO | 02/095869 A1 | 11/2002 |
| WO | 02/096166 A1 | 11/2002 |
| WO | 03/050913 A1 | 6/2003 |
| WO | 03/096475 A1 | 11/2003 |
| WO | 2004/025778 A1 | 3/2004 |
| WO | 2004019261 A2 | 3/2004 |
| WO | 2004021271 A1 | 3/2004 |
| WO | 2004/042868 A1 | 5/2004 |

WO    2004/075342 A1    9/2004

OTHER PUBLICATIONS

Zhang, Y. P. et al, Integration of a planar inverted F antenna on a cavity-down ceramic ball grid array package, IEEE Antennas and Propagation Society International Symposium, Jun. 16, 2002.
Mathews, et al., RF System in Package: Considerations, Technologies and Solutions, Apr. 2003.
RF/Wireless Design Services, Amkor Technology, Jun. 2003.
Cetiner, et al., Small Size Broadband Multielement Antenna for RF/Wireless Systems, Antennas and Wireless Propagation Letters, Jan. 2003.
Ojefors, Erik, Micromachined Antennas for Integration with Silicon Based Active Devices [Thesis], Uppsala University, Sweden, Mar. 2004.
Caswell, W.E.; Yorke, J.A., Invisible errors in dimension calculations: geometric and systematic effects, Dimensions and Entropies in Chaotic Systems, 1986.
Sherwani, N., Introduction to multichip modules, Wiley InterScience, 1995.
Chakraborty, S. et al., A 2.4-GHz radio front in RF system-on-package technology, Jun. 2002.
Chip scale package family, Amkor Technology, Jul. 5, 2000.
Kim, K. et al, A plane wave model approach to understanding propagation in an intra-chip communication system, IEEE Antennas and Propagation Society International Symposium, May 2001.
Midford, Thomas A. et al, The evolution of packages for monolithic microwave and millimeter-wave circuits, IEEE Transactions on antennas and propagation, Sep. 1995.
Jayaraj, K. et al, A low cost multichip packaging technology for monolithic microwave integrated circuits, IEEE Transactions on antennas and propagation, Sep. 1995.
Chakraborty, S. et al, A 2.4-GHz radio front in RF system-on-package technology, IEEE Microwave Magazine, Jun. 2002.
Chip scale package family, Amkor Technology, Jul. 2000.
Halbo, Electronic Components, Packaging and Production, University of Oslo, 1995.
Zhang, Cofired laminated ceramic package antenna for single-chip wireless transceivers, Microwave and Optical Technology Letters, Apr. 2002, vol. 33, No. 10.
Virga, Low-profile enhanced-bandwidth PIFA antennas for wireless communications packaging, IEEE Transactions and Microwave Theory and Techniques, Oct. 1997, vol. 45, No. 10.
Li, Microstrip-fed cavity-backed slot antennas, Microwave and Optical Technology Letters, May 2002, vol. 33, No. 4.
Cetiner, Small size CPW-Fed chip antenna for integration with RF/Wireless communications systems, IEEE Antennas and Propagation Society International Symposium, 2002.
Cetiner, A packaged miniature antenna for wireless networking, International Symposium on Microelectronic International Microelectronics and Packaging Society, 2001.
Griffin, Donald W. et al., "Electromagnetic Design Aspects of Packages for Monolithic Microwave Integrated Circuit-Based Arrays with Integrated Antenna Elements", IEEE Transactions on Antennas and Propagation, Sep. 1995, pp. 927-931, vol. 43, No. 9.
Hall, P.S., "System Applications: The Challenge for Active Integrated Antennas", The University of Birmingham, Edgbaston, Birmingham, UK, undated (5 pp.).
Kim, Kihong et al., "Integrated Dipole Antennas on Silicon Substrates for Intra-Chip Communication", IEEE, pp. 1582-1585, 1999.
Papapolymerou, Ioannis et al., "Micromachined Patch Antennas", IEEE Transactions on Antennas and Propagation, vol. 46, No. 2, pp. 275-283, Feb. 1998.
Bluetooth Radio, (visited Oct. 31, 2006)<http://www.palowireless.com/database/ericsson/pba31301r1e.pdf>.
Harris, S., et al., "Handset industry debate Bluetooth chip options", WirelessEurope, May 2002.
Hansen, R.C., "Fundamental Limitations on Antennas", Proc. IEEE, vol. 69, No. 2, Feb. 1981.
Judd, K., et al., "Estimating dimensions with confidence", International Journal of Bifurcation and Chaos 1,2 (1991) 467-470.

H. Tanidokoro, H., et al., "1-Wavelength Loop Type Dielectric Chip Antennas", Antennas and Propagation Society International Symposium, 1998, IEEE, vol. 4, 1998.
Matsushima, H., et al. "Electromagnetically coupled dielectric chip antenna", Antennas and Propagation Society International Symposium, IEEE, vol. 4, 1998.
Lim, K., et al., "RF-System-On-Package (SOP) for Wireless Communications", IEEE Microwave Magazine, vol. 3, No. 1, Mar. 2002.
Zhang, Y.P., et al., "Integration of a Planar Inverted F Antenna on a Cavity-Down Ceramic Ball Grid Array Package", IEEE Symp. on Antennas and Propagation, Jun. 2002.
Wheeler, H. A., "Fundamental Limitations of Small Antennas". Proc. IEE, Dec. 1947, 35#12, pp. 1479-1484.
Zhao, J., et al., "Design of 'Chip-Scale' Patch Antennas for 5-6GHz Wireless Microsystems", 2001 IEEE. International Symposium, 0-7803-7070-8.
Chu, L. J., "Physical Limitations of Omni-Directional Antennas", Dec. 1948, of Applied Physics, vol. 19, Issue 12, pp. 1163-1175.
Singh, D., "Small H-Shaped Antennas for MMIC Applications", Jul. 2000, IEEE Transactions on Antennas and Propagation, vol. 48, Issue: 7, pp. 1134-1141, ISSN: 0018-926X.
Song, P. C. T., "Novel antenna design for future mobile systems", University of Birmingham, United Kingdom, May 2001.
"RF/ Wireless design services", Amkor Technology, Jun. 2003.
Davis, M. F. et al., "RF-microwave multi-layer integrated passives using fully organic system on package (SOP) technology", IEEE MTT-S International microwave symposium digest, May 2001.
Laskar, J. et al., "Development of integrated 3D radio front-end system-on-package (SOP)", 23rd Annual Technical Digest Gallium Arsenide Integrated Circuit, Oct. 2001.
Pinel, S. et al., "3D integrated LTCC module using BGA technology for compact C-band RF front-end module", IEEE MTT-S International microwave symposium digest, Jun. 2002.
Chakraborty, S. et al., "Development of an integrated bluetooth RF transceiver module using multi-layer system on package technology", IEEE Radio and wireless conference, Aug. 2001.
Desclos, L., "V-Band double-slot antenna integration on LTCC substrate using thick-film technology", Microwave and Optical Technology Letters, Mar. 2001.
Bhavsar, Samir A.: Letter: *Fractus v. Samsung et al.,* Case No. 6:09-cv-00203-LED: Disclosure of Material Information to the USPTO; Oct. 28, 2009.
Wille, David G.: HTC's First Amended Answer and Counterclaim; Oct. 2, 2009.
Wimer, Michael C.; USPTO Office Actions for U.S. Appl. No. 10/422,578; Oct. 4, 2004, Apr. 7, 2005, Aug. 24, 2005, Jan. 26, 2006, Mar. 12, 2007, Aug. 23, 2007 and Mar. 26, 2008.
D.A. Russell, J.D. Hanson, E. Ott, "Dimension and Strange Attractors", Phys. Rev. Lett. 45 (1980) 1175-1178.
Paul So., Ernest Barreto, and Brian R. Hunt, "Box-counting dimension without boxes: Computing D0 from average expansion rates", Physical Review E (Statistical Physics, Plasmas, Fluids, and Related Interdisciplinary Topics)—Jul. 1999—vol. 60, Issue 1, pp. 378-385.
http://www.redbrick.dcu.ie/~bolsh/thesis/node16.html.
http://www.redbrick.dcu.ie/~bolsh/thesis/node22.html.
http://www.sewanee.edu/physics/PHYSICS123/BOX%20COUNTING%20DIMENSION.html.
Heinz-Otto Peitgen, et al, "Chaos and Fractals—New Frontiers of Science" (1992), pp. 212-216, 387-388.
Paul S. Addison, "Fractals and Chaos—An illustrated Course" (Institute of Physics Publishing, Bristol and Philadelphia; IOP Publishing 1997), pp. 30, 31 &33.
Kenneth Falconer, "Fractal Geometry—Mathematical Foundations and Applications" (2nd edition) (John Wiley & Sons. Ltd., 2003) (the first edition is from 1990).
Yuan Y. Tang. et al., "The application of Fractal Analysis to Feature Extraction" (1999 IEEE). pp. 875-879.
Vincent Ng. et al., "Diagnosis of Melanoma with Fractal Dimensions" (IEEE TENCON'93 / Beijing), pp. 514-517.
S. Kobayashi et al., "Estimation of 3d Fractal Dimension of Real Electrical Tree Patterns" (IEEE 1994; Proceedings of the 4th International Conference on Properties and Applications of Dielectric Materials, Jul. 3-8, 1994 Brisbane, Australia), pp. 359-362.

Jie Feng et al., "Fractional Box-Counting Approach to Fractal Dimension Estimation", (IEEE 1996; Proceedings of ICPR'96), pp. 854-858.

S. Rouvier, et al., "Fractal Analysis of Bidimensional Profiles and Application to Electromagnetic Scattering from Soils" (1996 IEEE), pp. 2167-2169.

Nirupam Sarkar, et al., "An Efficient Differential Box-Counting Approach to Compute Fractal Dimension of Image" (IEEE Transactions on Systems, Man, and Cybernetics, vol. 24, No. 1, Jan. 1994), pp. 115-120.

Susan S. Chen, et al., "On the Calculation of Fractal Features from Images" (IEEE Transactions on Pattern Analysis and Machine Intelligence, vol. 15, No. 10, Oct. 1993), pp. 1087-1090.

Alan I. Penn, et al., "Fractal Dimension of Low-Resolution Medical Images" (18th Annual International Conference of the IEEE Engineering in Medicine and Biology Society, Amsterdam 1996; 4.5.3: Image Pattern Analysis I), pp. 1163-1165.

Fabrizio Berizzi, et al., "Fractal Analysis of the Signal Scattered from the Sea Surface" (IEEE Transactions on Antennas and Propagation, vol. 47, No. 2, Feb. 1999), pp. 324-338.

Hendrik F. V Boshoff, "A Fast Box Counting Algorithm for Determining the Fractal Dimension of Sampled Continuous Functions" (1992 IEEE), pp. 43-48.

Aug. 14, 2003 Reply to Examination Report for EP1258054 (00909089.5).

Oct. 28, 2004 Summons for EP1258054 (00909089.5).

Dec. 15, 2004 Letter Dealing with Oral Proceedings for EP1258054 (00909089.5).

Jan. 2005 Minutes from Oral Proceedings for EP1258054 (00909089.5).

International Preliminary Examination Report and International Search Report of Aug. 29, 2002 for PCT/EP00/00411 published as WO 01/54225 A1.

EPO Office Action for EP1258054 (00909089.5) dated Feb. 7, 2003.

Hansen, R. C.: "Fundamental Limitations in Antennas"; Proceedings of the IEEE, IEEE. New York, US; Feb. 1981; ISSN 0018-9219, vol. 2, NR. 69, pp. 170-182.

Ramesh Garg et al., "Microstrip Antenna Design Handbook" (2001, Artech House, Inc.), selected pages.

Richard C. Johnson (Editor), "Antenna Engineering Handbook" (McGraw Hill Inc.), Chapter "Microstrip Antennas" by Robert E. Munson, selected pages.

Constantine A. Balanis, "Antenna Theory" (1982, John Wiley & Sons, Inc.),selected pages.

Keith R. Carver et al., "Microstrip Antenna Technology" (IEEE Transactions on Antennas and Propagation, vol. AP-29, No. 1, Jan. 1981), pp. 2-23.

David M. Pozar et al., "Microstrip Antennas—The Analysis and Design of Microstrip Antennas and Arrays" (1995, Institute of Electrical and Electronic Engineers, Inc.), p. ix and 3.

John D. Kraus, "Antennas" (1988, McGraw-Hill, Inc.), preface and list of contents.

* cited by examiner

RADIO-FREQUENCY SYSTEM IN PACKAGE INCLUDING ANTENNA

CROSS-REFERENCE TO RELATED APPLICATIONS

This application claims the benefit of priority afforded by patent application PCT/EP2004/004851, entitled "Radio-Frequency System In Package Including Antenna," filed on May 6, 2004 and by patent application Ser. No. 11/488,107 (filed Jul. 17, 2006), which is a continuation of application Ser. No. 11/040,622, now U.S. Pat. No. 7,095,372, filed on Jan. 21, 2005, which is a continuation of application no. PCT/EP02/12427, filed on Nov. 7, 2002.

BACKGROUND OF THE INVENTION

The present invention relates generally to novel integrated circuit packages that include a new family of miniature antennas in the package.

There is a trend in the semiconductor industry towards the so-called System on Chip (SoC) and System on Package (SoP) concepts. The full integration of systems or subsystems into a single chip, package or module provides many advantages in terms of cost, size, weight, consumption, performance and product design complexity. Several electronic components for consumer applications, such as handsets, wireless devices, personal digital assistants (PDAs) or personal computers (PCs) are becoming more and more integrated into SoP/SoC products.

The concept of integrating a miniature antenna into a package or module is especially attractive owing to the tremendous growth and success of cellular and wireless systems. In particular, there is a new generation of short/medium range wireless applications such as Bluetooth™, Hyperlan, IEEE802.11 and ultra wide band (UWB), Wimax and ZigBee systems where the progressive system integration into a single, compact product is becoming a key success factor (see for instance, S. Harris and H. Johnston, "Handset Industry Debate Bluetooth™ Chip Options", *WirelessEurope*, May 2002).

This concept of integrating a miniature antenna into a package or module is especially attractive as well in GSM, UMTS, PCS 1900, KPCS, CDMA, WCDMA, and GPS.

There have been reported several attempts to integrate an antenna in a package or module. These designs feature two important limitations: first the operating frequency must be large enough to allow a conventional antenna to fit inside the chip; second the antenna performance is poor in terms of gain, mainly due to the losses in the semiconductor material. According to D. Singh, et al., the smallest frequency in which an antenna has been integrated together with an electronic system inside the same was 5.98 GHz. Typical gains that have been achieved with such designs are around −10 dBi.

In general, there is a trade-off between antenna performance and miniaturization. The fundamental limits on small antennas were theoretically established by H. Wheeler and L. J. Chu in the middle 1940's. They stated that a small antenna has a high quality factor (Q), because of the large reactive energy stored in the antenna vicinity compared to the radiated power. Such a high quality factor yields a narrow bandwidth; in fact, the fundamental derived in such theory imposes a maximum bandwidth given a specific size of a small antenna. Related to this phenomenon, it is also known that a small antenna features a large input reactance (either capacitive or inductive) that usually has to be compensated with an external matching/loading circuit or structure. It also means that it is difficult to pack a resonant antenna into a space which is small in terms of the wavelength at resonance. Other characteristics of a small antenna are its small radiating resistance and its low efficiency (see, R. C. Hansen, Fundamental Limitations on Antennas, Proc. IEEE, vol. 69, no. 2, February 1981).

Some antenna miniaturization techniques rely basically on the antenna geometry to achieve a substantial resonant frequency reduction while keeping efficient radiation. For instance, patent application WO 01/54225 A1 discloses a set of space-filling antenna geometries (SFC) that are suitable for this purpose. Another advantage of such SFC geometries is that in some cases they feature a multiband response.

The dimension (D) is a commonly used parameter to mathematically describe the complexity of some convoluted curves. There exist many different mathematical definitions of dimension but in the present document the box-counting dimension (which is well-known to those skilled in advanced mathematics theory) is used to characterize some embodiments (see discussion on the mathematical concept of dimension in W. E. Caswell and J. A. Yorke, "Invisible Errors in Dimension Calculations: Geometric and Systematic Effects", *Dimensions and Entropies in Chaotic Systems*, G. Mayer-Kress, editor, Springer-Verlag, Berlin 1989, second edition, pp. 123-136 or K. Judd, A. I. Mees, "Estimating Dimensions with Confidence", *International Journal of Bifurcation and Chaos*, 1,2 (1991) 467-470).

So-called chip-antennas are described in H. Tanidokoro, N. Konishi, E. Hirose, Y. Shinohara, H. Arai, N. Goto, "1-Wavelength Loop Type Dielectric Chip Antennas", Antennas and Propagation Society International Symposium, 1998, *IEEE*, vol. 4, 1998 ("Tanidokoro, et al.") or H. Matsushima, E. Hirose, Y. Shinohara, H. Arai, N. Golo, "Electromagnetically Coupled Dielectric Chip Antenna", Antennas and Propagation Society International Symposium, *IEEE*, vol. 4, 1998. Those are typically single component antenna products that integrate only the antenna inside a surface-mount device. To achieve the necessary wavelength compression, those antennas are mainly constructed using high permitivity materials such as ceramics. The drawbacks of using such high permitivity materials are that the antenna has a very narrow bandwidth, the material introduces significant losses, and the manufacturing procedure and materials are not compatible with most package manufacturing techniques; therefore they do not currently include other components or electronics besides the antenna, and they are not suitable for a FWSoC or FWSoP.

There have been recently disclosed some RF SoP configurations that also include antennas on the package. Again, most of these designs rely on a conventional microstrip, shorted patch or PIFA antenna that is suitable for large frequencies (and therefore small wavelengths) and feature a reduced gain. In K. Lim, S. Pinel, M. Davis, A. Sutono, C. Lee, D. Heo, A. Obatoynbo, J. Laskar, E. Tantzeris, R. Tummala, "RF-System-On-Package (SOP) for Wireless Communications", *IEEE Microwave Magazine*, vol. 3, no. 1, March 2002 ("Lim, et al."), a SoP including an RF front-end with an integrated antenna is described. The antenna comprises a microstrip patch backed by a cavity which is made with shorting pins and operates at 5.8 GHz. As mentioned in Lim, et al., it is difficult to extend those designs in the 1-6 GHz frequency range where most current wireless and cellular services are located, mainly due to the size of conventional antennas at such large wavelengths. Another design for an antenna on a package is disclosed in Y. P. Zhang, W. B. Li, "Integration of a Planar Inverted F Antenna on a Cavity-Down Ceramic Ball Grid Array Package", IEEE Symp. on Antennas and Propagation, June 2002. Although the antenna operates at the Bluetooth™ band (2.4 GHz), the IC package is substantially large (15×15 mm) and the antenna performance is poor (gain is below −9 dBi).

Patent application EP 1126522 describes a particular double S-shaped antenna design that is mounted on a BGA package. Although no precise data is given on the package size in the application, typically, S-shaped slot antennas resonate at a wavelength on the order of twice the unfolded length of the S-shaped pattern. Again, this makes the whole package too large for typical wireless applications where the wavelength is above 120 mm. Also, this design requires a combination with high permitivity materials that, in turn, reduce the antenna bandwidth, increase its cost and decreases the overall antenna efficiency.

Regarding the package construction and architecture, there are several standard configurations depending mainly on the application. Some basic architectures are: single-in-line (SIL), dual-in-line (DIL), dual-in-line with surface mount technology DIL-SMT, quad-flat-package (QFP), pin grid array (PGA) and ball grid array (BGA) and small outline packages. Other derivatives are for instance: plastic ball grid array (PBGA), ceramic ball grid array (CBGA), tape ball grid array (TBGA), super ball grid array (SBGA), micro ball grid array BGA® and leadframe packages or modules. A description of several standard packaging architectures can be found on the websites of several package manufacturers, e.g.: www.amkor.com (see also L. Halbo, P. Ohlckers, *Electronic Components, Packaging and Production*, ISBN: 82-992193-2-9).

In PCT/EP02/12427 (filed as well by the applicant, but not published when this current application was filed), attempts have been made in order to incorporate a miniature antenna to a package together with a semiconductor die.

Although this arrangement is suitable for certain applications it involves some disadvantages. More components in the package leads to a bigger size of the system. Another reason not to have a fully integrated solution is that some manufacturers incorporate their own processors onto the printed circuit board (PCB) and prefer to incorporate a package or module antenna rather than a fully integrated package. Moreover, having a circuit in the same package or module as the die itself, can increase the amount of heat to be dissipated and might lead to an increase of temperature of the whole system causing a malfunction of the die. Besides, interference between the antenna and the die might occur. This could lead to a decrease in the performance of the system.

In the last few years, several improvements in packaging technology have appeared mainly due to the development of Multichip Module (MCM) applications (see, for instance, N. Sherwani, Q. Yu, S. Badida, *Introduction to Multi Chip Modules*, John Wiley & Sons, 1995). Those consist of an integrated circuit package that typically contains several chips (i.e., several semiconductor dies) and discrete miniature components (biasing capacitors, resistors, inductors). Depending on the materials and manufacturing technologies, MCM packages are classified in three main categories: laminated (MCM-L), ceramic (MCM-C) and deposited (MCM-D). Some combinations thereof are possible as well, such as e.g. MCM-L/D and other derivations such as Matsushita ALIVH. These MCM packaging techniques cover a wide range of materials for the substrate (for instance E-glass/epoxy, E-glass/polyimide, woven Kevlar/epoxy, s-glass/cyanate ester, quartz/polymide, thermount/HiT$^a$ epoxy, thermount/polyimide, thermount/cyanate ester, PTFE, RT-Duroid 5880, Rogers RO3000® and RO4000®, polyiolefin, alumina, sapphire, quartz glass, Corning glass, beryllium oxide and even intrinsic GaAs and silicon) and manufacturing processes (thick film, thin film, silicon thin film, polymer thin film, LTCC, HTCC).

SUMMARY OF THE INVENTION

The objective technical problem to be solved by the invention is to provide a system with improved characteristics in view of the prior art, said device being applicable in various ways.

This problem is solved by the features of the independent claims. Further embodiments of this invention result from the dependent claims.

The present invention generally relates to novel integrated circuit packages, modules or systems comprising a new family of miniature antennas according to the any independent claim. Also, the invention relates to several novel ways of arranging the materials and components of the package to include the antenna. Particularly, main advantages of the invention are as follows:

the small size of the antenna, which allows the use of very small packages (such as for instance chip scale packages ("CSP")) at typical wireless wavelengths;

the antenna geometry that enables such a miniaturization;

the arrangement of the antenna in the package;

the compatibility of the antenna design with virtually any state of the art packaging architecture;

scaled and distributed devices can be put together in an economical and efficient way;

the heating-up effect of the package can be dissipated to an external component or an additional package, reducing the risk of malfunction of the device;

several packages can be combined/put together, e.g. packages of RF circuits and/or antennas to be e.g. maintained by a processor to combine signals to be used in a multiple input multiple output (MIMO) environment. This might lead to a scalability of the packages according to the demands of the respective environment or system.

In contrast to the chip-antennas as described in Tanidokoro, et al., the present invention relies on the specific novel design of the antenna geometry and its ability to use the materials that are currently being used for integrated circuit package construction, so that the cost is minimized while allowing a smooth integration with the rest of the system.

The objective problem is solved by a system comprising at least one antenna and a circuit, wherein the circuit is at least in part not a silicon chip or a die. The at least one antenna and the circuit are arranged on a package.

The problem is also solved by a system comprising at least one antenna and at least one circuit, wherein the at least one antenna and the at least one circuit are arranged on a package, wherein the at least one circuit performs a base-band and/or a digital functionality.

This base-band functionality comprises e.g.:

Conversion from a digital bitstream to a sequence of symbols in transmission, or symbol acquisition and digital data regeneration in reception;

Clock recovery and symbol synchronization;

Automatic gain control;

Error correction algorithms;

Data encryption/decryption;

Channel estimation for adaptive detection;

Memory blocks (for example for temporary data storage, for programming other digital blocks, etc.);

Transmission/Reception buffers for storage of received packets and packets to be transmitted; or Microprocessors and/or microcontrollers to carry out data processing, control tasks (like data handshaking with other chips), implement communication ports protocols (like USB) or audio features (like an audio CODEC).

In an embodiment of the invention the (at least one) circuit comprises a radio-frequency circuit (RF-circuit). In particular, the coupling between the at least one antenna and the radio-frequency circuit can be a reactive coupling, in particular a capacitive or inductive coupling.

In another embodiment, the radio-frequency circuit is connected to or located on a ground plane.

Yet another embodiment is directed to at least some of the connections of the radio-frequency circuit being balanced.

In another embodiment, a radio-frequency component is arranged outside the package. In particular, this radio-frequency component could be a matching network. As a further option, the radio-frequency component can be a matching network, a bypass or a through-connection.

Optionally, the radio-frequency circuit on the package can be a matching network, a bypass or a through-connection.

It is to be noted that the radio-frequency component arranged outside the package could be an external circuit as well as an external sub-circuit, the latter e.g. being part of a larger circuit. This external circuit or sub-circuit can be or comprise a radio-frequency circuit, respectively.

Furthermore, the radio-frequency component outside the package as well as the radio-frequency circuit on the package can be a power amplifier, respectively.

Some other possibilities of components that could be part of the radio-frequency circuit (internal) or radio-frequency component (external to the package) are:

Power amplifier;
Low noise amplifier;
Filters;
Diplexer;
Local oscillators (like a quartz crystal oscillator);
Modulator/demodulator;
Switch;
Mixer;
(Signal) Detector;
Phase shifter; or
balun.

In yet another embodiment the at least one antenna is connected to the radio-frequency circuit and at least in part the radio-frequency circuit is connected to the radio-frequency component outside the package.

In an additional embodiment, the at least one antenna is connected to the radio-frequency component outside the package directly.

Furthermore, the radio-frequency circuit can comprise a balun. Preferably, this balun can be incorporated as a printed circuit or as a discrete component. Additionally, the balun can be placed inside the package or outside of the package.

In another embodiment, the ground plane is not located underneath or on top of the at least one antenna. In particular, the projection of the antenna should not be on a ground plane.

In particular, the package can be an integrated circuit package (IC package).

Another embodiment is directed to a system, wherein the radio-frequency circuit or the radio-frequency component includes at least one filter. Preferably, this filter is or comprises a band-pass characteristic. Additionally, other filter types as high-pass or low-pass filters or combinations thereof can be provided.

A next embodiment is directed to the at least one antenna being connected to an input/output connector of the package and at least a part of the circuit being connected to an input/output connector of the package. Said connectors can be the same or different ones.

In another embodiment the at least one antenna is a space filling antenna. Preferably, the space filling antenna has a dimension bigger than 1.

In fact, there exist several definitions of the dimension, e.g. a box counting dimension and a grid dimension. Preferably, these dimensions amount to numbers between 1 and 2, respectively, in particular the dimensions amount to 1.0, 1.1, 1.2, 1.3, 1.4, 1.5, 1.6, 1.7, 1.8, 1.9, 2.0. The respective value depends on the miniaturization of the packet size.

In particular, space filling is directed to the ability of filling the space where the curve is located. This space could be an approximated surface or some sort of three-dimensional volume.

In general, increasing the number of segments, reducing the size of the segments, narrowing the angles between the segments and increasing the dimension of the curve will lead to further miniaturization, respectively.

As a subsequent embodiment, the antenna can comprise a conducting pattern at least a portion of which includes a curve, wherein said curve comprises at least five segments. Each of the at least five segments forming a pair of angles with each adjacent segment in said curve and at least three of said segments are shorter than $\frac{1}{10}$ of the longest free-space operating wavelength of said at least one antenna.

In particular, the smaller angle of the pair of angles between adjacent segments is less than 180° C. and at least two of said smaller angles between adjacent section segments are less than 115° C., wherein at least two of the angles, which are on the same side of the curve and are formed from adjacent segments of the group of said at least five segments, are different.

As a subsequent option, said conducting pattern fits inside a rectangular area, the longest side of said rectangular area being shorter than $\frac{1}{5}$ of the longest free-space operating wavelength of said at least one antenna.

The number of "at least five" segments can as well be in particular seven, nine, eleven, fifteen, twenty or twenty-five segments.

In another embodiment, at least the at least one antenna and/or the radio frequency circuit comprise(s) a connection with a radio-frequency input/output connector. In addition, the radio-frequency component outside the package can as well comprise such a connection with a radio-frequency input/output connector.

In particular, the at least one antenna can be a modular or a discrete component. As an option, the modular or discrete component can be a surface mount technique component (SMT component).

In a further embodiment, both ends of the at least one antenna can be connected to the package, in particular to Input/Output connectors of the package. In a particular embodiment, both ends of the antenna are connected to Input/Output connectors of the package.

Another embodiment is directed to the at least one antenna being a parasitic element. This parasitic element can be incorporated inside the package or, as an alternative, outside the package.

In yet another embodiment the system comprises at least one external antenna.

In addition, the system can comprise a switch. This switch can be placed outside or on the package. As a next embodiment, the switch can be used to commute between the at least one (internal) antenna and the at least one external antenna.

The switch can be a jumper or a bypass, or any mechanical switch with several positions to select manually a distinct antenna from several available antennas. The switch can also be an electromechanical switch (like a relay), or an electronic switch like a transistor, FET, FLIP-FLOP or the like.

The use of a switch to select between the at least one (internal) antenna and the at least one external antenna could be used to implement an antenna diversity system. The technique of antenna diversity consists of providing several antennas to the receiver as a way to protect the receiver from signal fading in the communication channel. The antennas must be arranged so that there is little, or no, correlation between the signals received by each one of them.

In an alternative embodiment, the at least one antenna is not physically connected to any other component. This might as well apply to the external antenna mentioned above.

Furthermore, the at least one antenna could be a balanced or an unbalanced antenna.

In addition, the at least one antenna can be loaded with discrete reactive components, e.g. capacitors and/or inductors.

As another embodiment, the antenna can be loaded with external loads.

Another embodiment comprises several systems as described above, wherein the antennas are forming a multiple antenna communication system.

This multiple antenna communication system can be a multiple-input-multiple-output system, a smart antenna system, a phased array system or a sensor network.

For certain applications it is advantageous as well to separate the radio frequency band from the base band, because of interference problems between both parts. Higher quality components, which might need more space could be used if one part of the signal processing circuit is placed outside the package.

The technique of having a separate outside part of the (functional) circuit systematically opens the possibility to use existing components outside the package, such as e.g. clocks, oscillators or filters.

BRIEF DESCRIPTION OF THE DRAWINGS

Embodiments of the invention will be illustrated and explained hereinafter on the basis of the drawings.

DETAILED DESCRIPTION OF THE EMBODIMENTS

Figure 1:
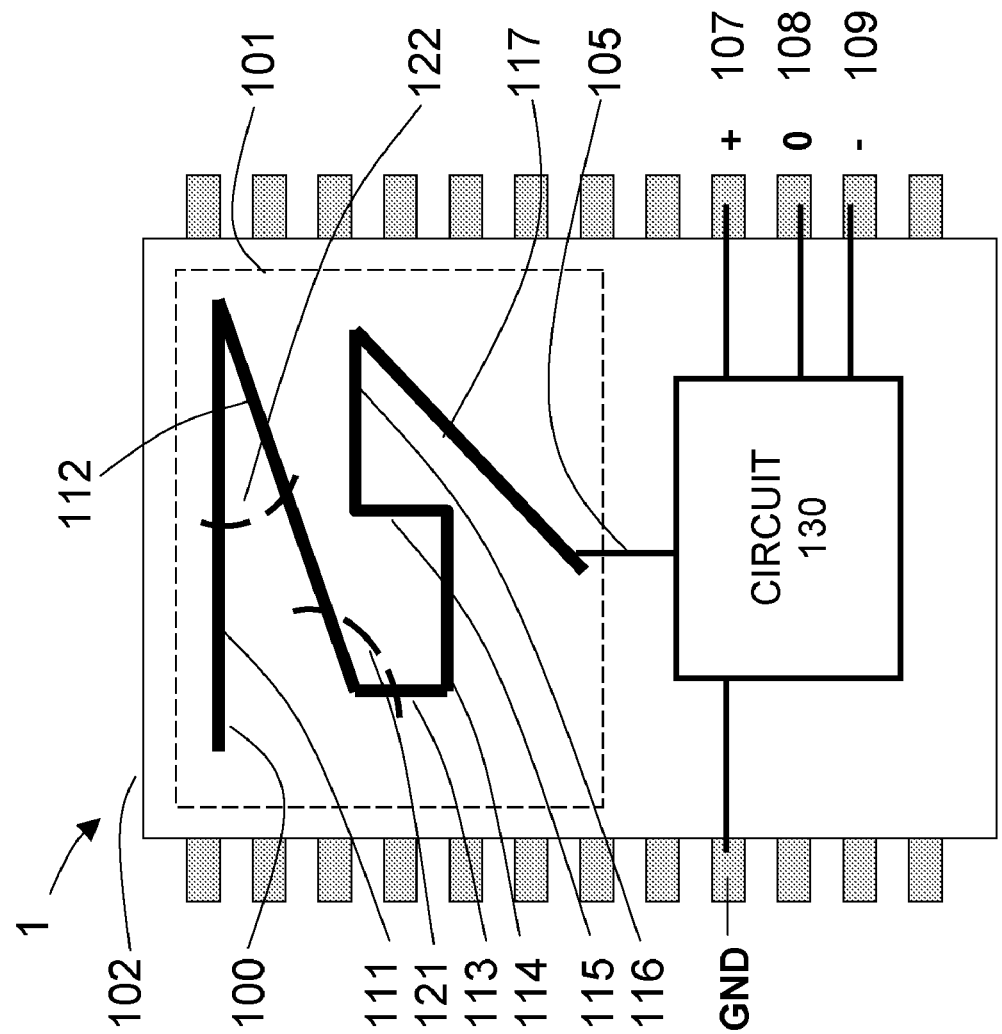
FIG. 1 shows an embodiment of a package including an antenna and a circuit.

FIG. 1 shows an embodiment of a package 1 including an antenna 100 in an area 101 and a circuit 130. Both, the antenna 100 and the circuit 130 are arranged on a substrate 102. Preferably, there is no ground plane underneath the antenna 100, i.e. the area 101 is free of any conductive material, at least in 50% of the surface above or below area 101. Particularly, the only metal that is placed below or above the antenna pattern are the connectors (such as for instance wire bonds or metal strips).

The antenna 100 is a monopole antenna with a single radiating arm comprising seven segments 111 through 117. Preferably, the side length of the rectangular area 101 is the longest operating wavelength for the antenna divided by five. The antenna 100 forms at least two angles such as angle 121 and angle 122 being less than 115° C. Although not required, it is preferred that at least two of the angles that are less than 180° C. are defined in the clock-wise and counter clock-wise directions at the opposite sides of the curve (right side for 121, left for 122). The antenna curve 100 is fed through a connection 105 to a pad on the circuit 130, such a connection including, but not limited to, a wire bond.

The circuit 130 preferably is embodied as a radio-frequency circuit (RF circuit). The antenna 100 is connected to the RF circuit 130, transferring the unbalanced signal of the antenna 100 to the RF circuit 130. The RF circuit 130 can be connected to the ground plane of the antenna 100. The RF circuit provides some RF functionality needed in an RF front-end, like e.g. antenna impedance matching, unbalanced-to-balanced transformation, power amplifying, filtering, mixing, frequency conversion, etc.

The output connection of the RF circuit 130, as represented in the embodiment can be a balanced device. Optionally, the RF circuit 130 comprises a connection to a "0" level reference.

Alternatively, the output connection of the RF circuit 130 can be unbalanced. In such a case the common ground "GND" is an input signal for the RF circuit 130.

The RF circuit 130 is connected to the monopole antenna 100 and comprises optional connections to terminals like common ground "GND", 108 "0", 107 "+" and/or 109 "−".

Figure 2:
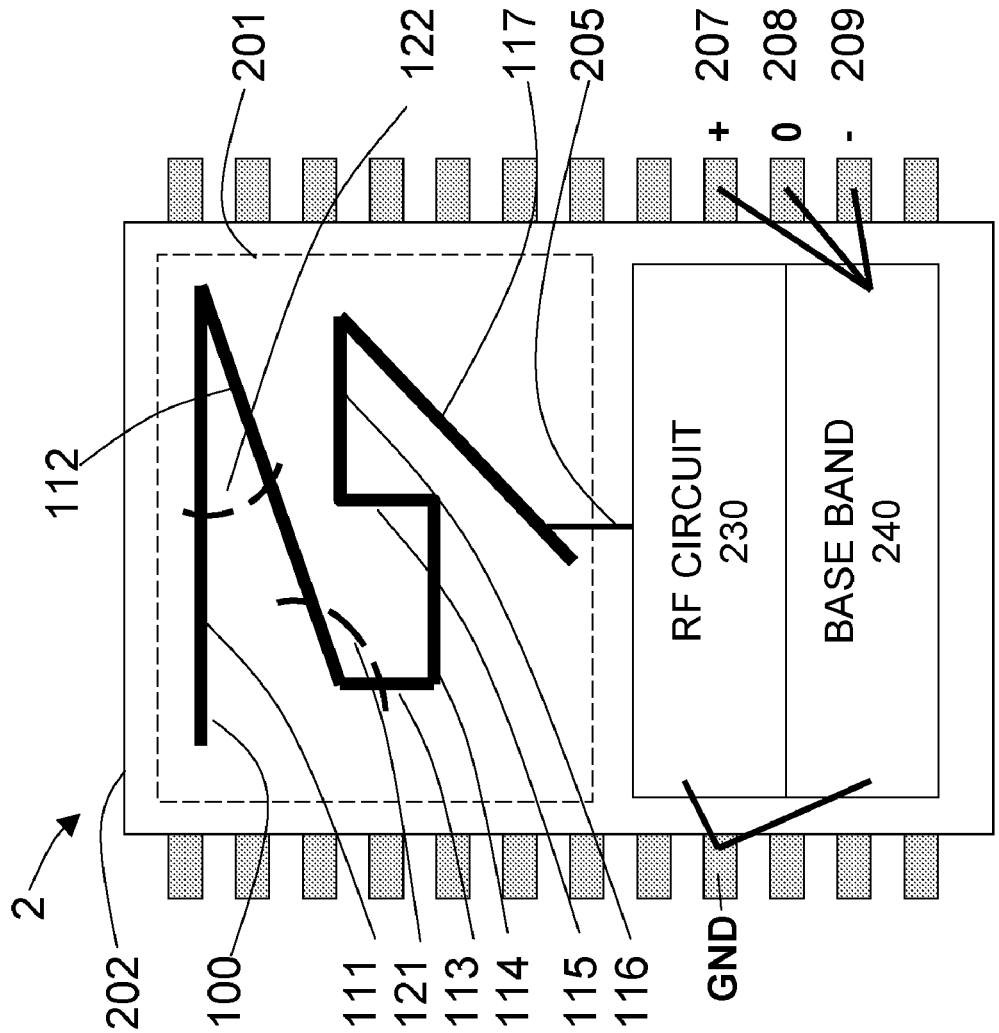
FIG. 2 shows an embodiment of a package including an antenna and a circuit composed by a base band circuit.

FIG. 2 shows an embodiment of a package 2 including the antenna 100 in an area 201 and a radio-frequency circuit (RF circuit) 230 together with a base band component 240 arranged on a substrate 202.

The antenna 100 has been described in FIG. 1 above. It comprises seven segments 111 through 117 and forms at least two angles 121 and 122 being less than 115° C. The antenna 100 is connected to the RF circuit 230 by a connection 205.

The RF circuit 230 and the base band component 240 are connected to the ground connector GND. The base band component 240 is connected to the terminals "+" 207, "0" 208 and "−" 209.

The base band component 240 provides at least some of the base band functionality required in the system, like for example conversion from a digital bitstream to a sequence of symbols, symbol acquisition, digital data regeneration, clock recovery, symbol synchronization, automatic gain control, error correction algorithms, data encryption and/or decryption, channel estimation for adaptive detection, analog-to-digital conversion, etc.

The RF circuit 230 performs at least some of the RF functionality needed in an RF front-end, like for example antenna impedance matching, balanced-to-unbalanced transformation, power amplifying, filtering, mixing, frequency conversion, etc.

Figure 3:
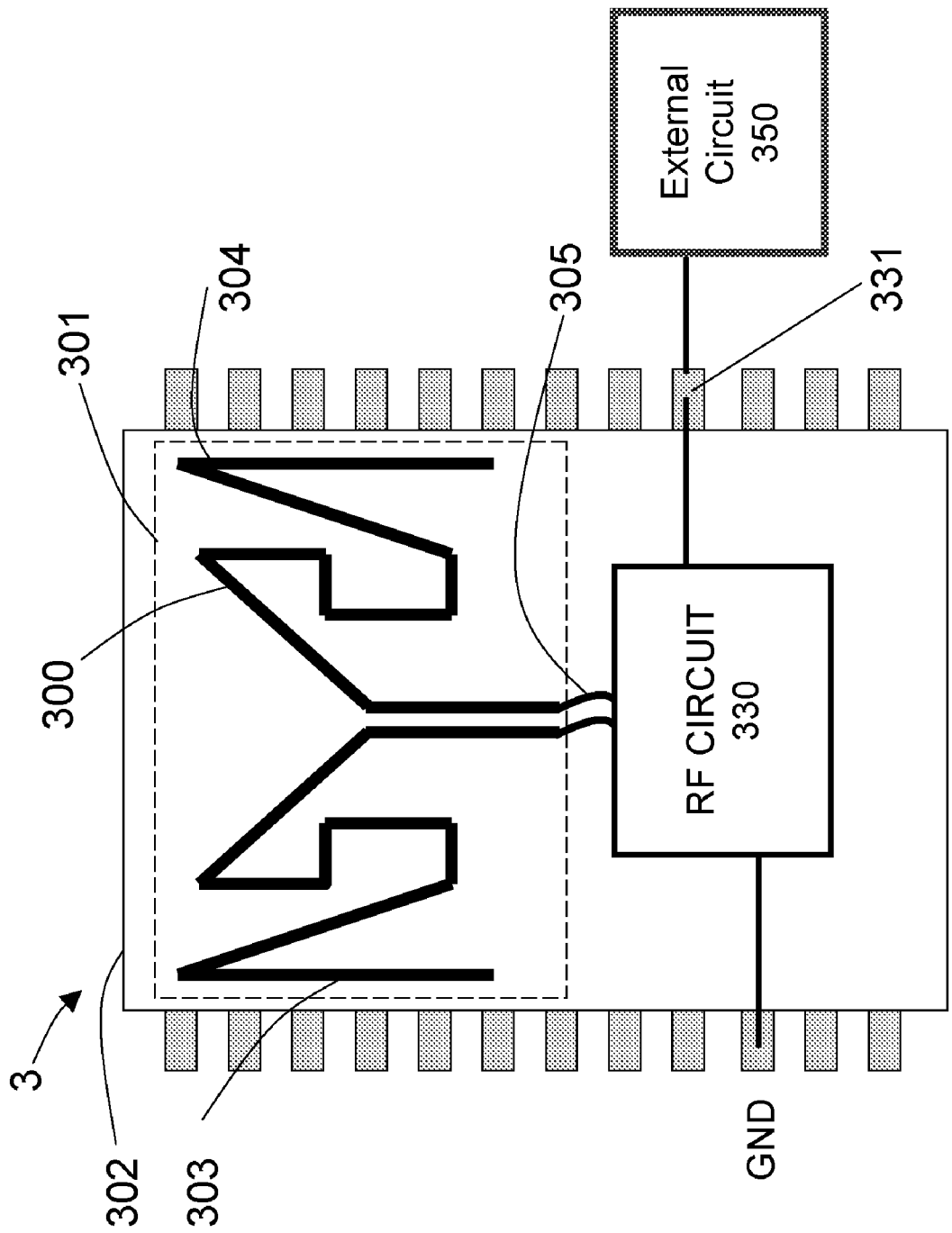
FIG. 3 shows an embodiment of a package including a dipole antenna and a radio-frequency circuit together with an additional circuit outside the package.

FIG. 3 shows an embodiment of a package 3 including a dipole antenna 300 and a radio-frequency circuit 330. An external circuit 350 is located outside the package 3. The dipole antenna 300 comprises two radiating arms 303 and 304 and is fed by a differential input/output terminal 305, which is provided by a couple of close connectors such as for instance two wire bonds. Other suitable feeding means could include two conducting strips placed on the same layer as the antenna, the two strips reaching directly or by means of a via hole, the solder balls of a flip-chip, or the pad connection region of a flip-chip connected by means of tape automatic bonding (TAB).

A substrate 302 can be embodied as a single layer or a multilayer, but in any case it leaves a clearance with no conducting material of at least 50% of the area 301 where the antenna is enclosed, in any of the layers above or below the layer on which the antenna is lying.

The antenna 300 is connected to the RF circuit 330, transferring the balanced signal to the RF circuit 330. The RF circuit 330 can be connected to ground. The RF circuit 330 performs at least some of the RF functionality needed in an RF front-end, like for example antenna impedance matching, balanced-to-unbalanced transformation, power amplifying, filtering, mixing, frequency conversion, etc.

The output signal 331 of the RF circuit 330 is unbalanced, and afterwards connected to an external circuit 350, which can be an external chip.

Alternatively, the output connection 331 of the RF circuit 330 can be balanced. In such case, two connections to different pins (two pins instead of one pin 331) of the package, preferably labeled as "+" and "−" are necessary, with the option of the presence of a third pin being the "0" level reference.

Figure 4:
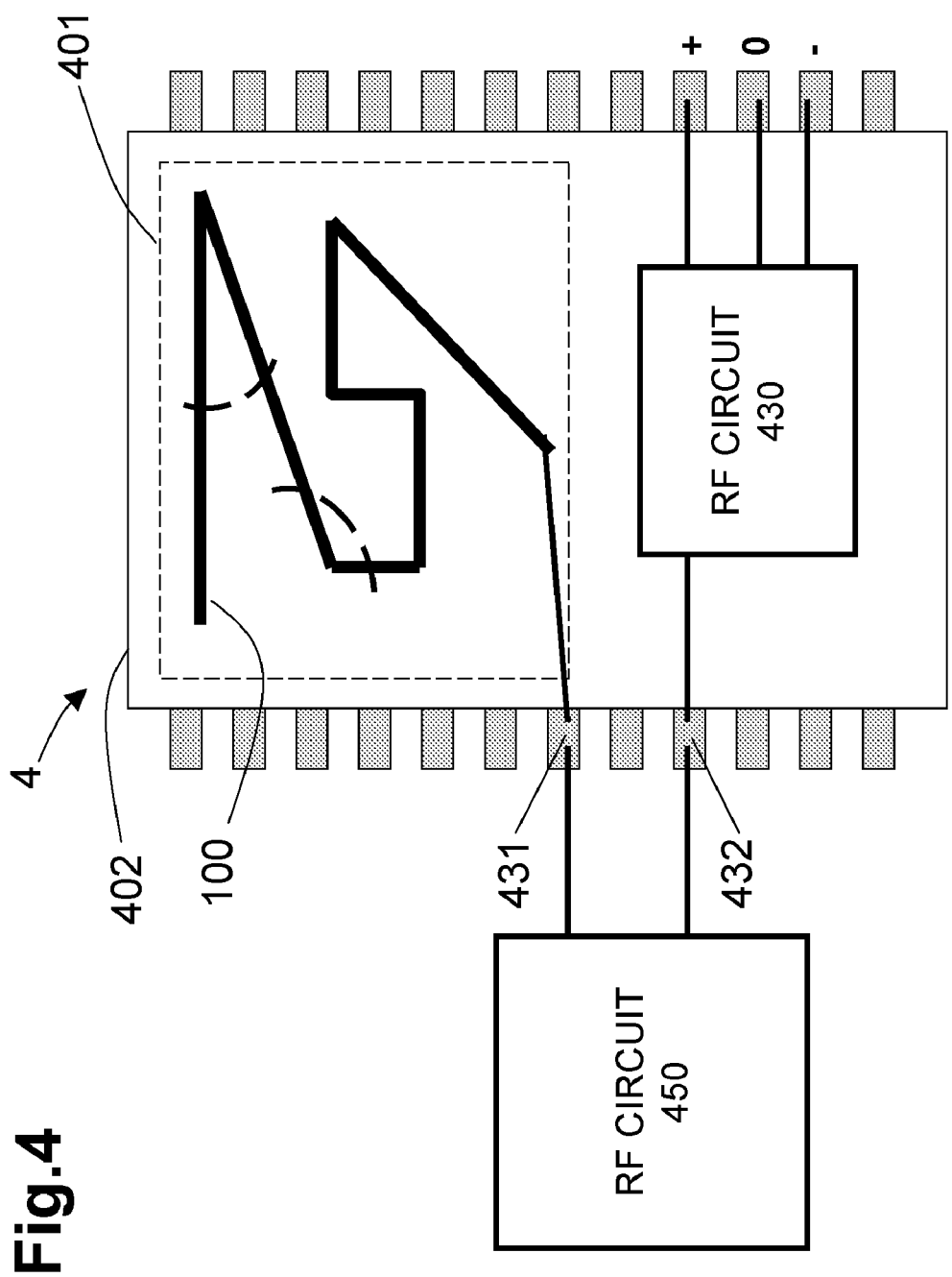
FIG. 4 shows an embodiment of a package including a monopole antenna and a circuit, both connected to a matching network outside the package.

FIG. 4 shows an embodiment of a package 4 including a (unbalanced) monopole antenna 100 (as described in FIG. 1) and an RF circuit 430, both connected to an external RF circuit 450, which is located outside the package 4.

A substrate 402 can be arranged as a single layer or a multilayer, but in any case it to leaves a clearance with no conducting material of at least 50% of the area 401 where the antenna is enclosed, in any of the layers above or below the layer on which the antenna is lying.

The antenna 100 and the RF circuit 430 are connected to at least one Input/Output connector (which can be a pin) of the package 4, respectively, i.e. pin 431 for the antenna 100 and pin 432 for the RF circuit 430. An interconnection between the antenna 100 and the RF circuit 430 is provided by the external RF circuit 450, which is preferably another RF (sub-) circuit external to the package. Preferably, the external RF circuit 450 can be a matching network, a bypass or a through-connection.

The RF circuit 430 could also be connected to the antenna 100, hence performing at least some RF functionality needed in an RF front-end. The external RF circuit 450 provides additional RF functionality, e.g. it could be a short circuit that establishes direct electrical contact between antenna 100 and RF circuit 430.

As indicated by FIG. 4, the output between the RF circuit 430 and the external RF circuit 450 (e.g. matching network) is unbalanced, but it could also be balanced instead.

As an alternative, the antenna 100 could be directly connected to the RF circuit 430, which is connected to the external RF circuit 450, which can optionally be a matching network.

Figure 5:
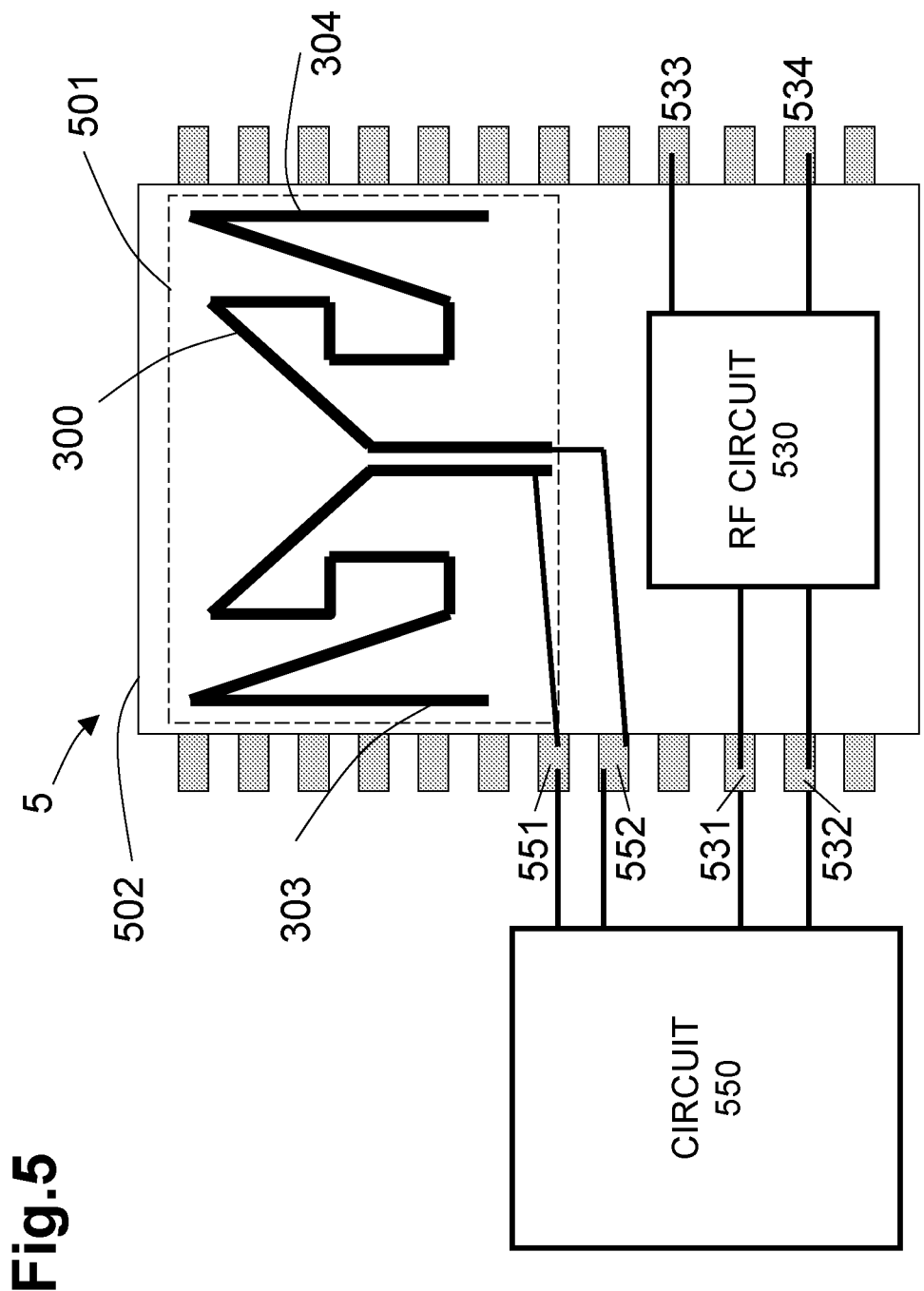
FIG. 5 shows an embodiment of a package including a balanced antenna and a radio-frequency circuit together with an additional circuit outside the package.

FIG. 5 shows an embodiment of a package 5 including a balanced antenna 300 (as described in FIG. 3) and a radio-frequency circuit 530 (RF circuit). An additional circuit 550 is placed outside the package 5.

A substrate 502 can be arranged as a single layer or a multilayer, but in any case it leaves a clearance with no conducting material of at least 50% of the area 501 where the antenna is enclosed, in any of the layers above or below the layer on which the antenna is lying.

Both arms 303 and 304 of the antenna 300 are connected to a respective terminal of the package 5, i.e. arm 303 is connected to terminal 551 and arm 304 is connected to terminal 552. These terminals 551 and 552 of the package 5 are connected to the external circuit 550. Via terminals 531 and 532 the RF circuit 530 of the package 5 is connected to the circuit 550, whereas the RF circuit 530 is further connected to terminals 533 and 534 of the package 5. These terminals 533 and 534 are the input/output connectors to which an external RF front-end (not shown) can be connected.

This embodiment is similar to what has been described with FIG. 3, but the antenna 100 being balanced. Preferably, all connections shown in FIG. 5 are balanced, although at least some of them could be unbalanced as well.

This embodiment is advantageous to be applied for an external power amplifier (PA), because this amplifier typically is differential (i.e. balanced) in order to enable noise suppression and in order to minimize unnecessary heating-up of the amplifier.

Figure 6:
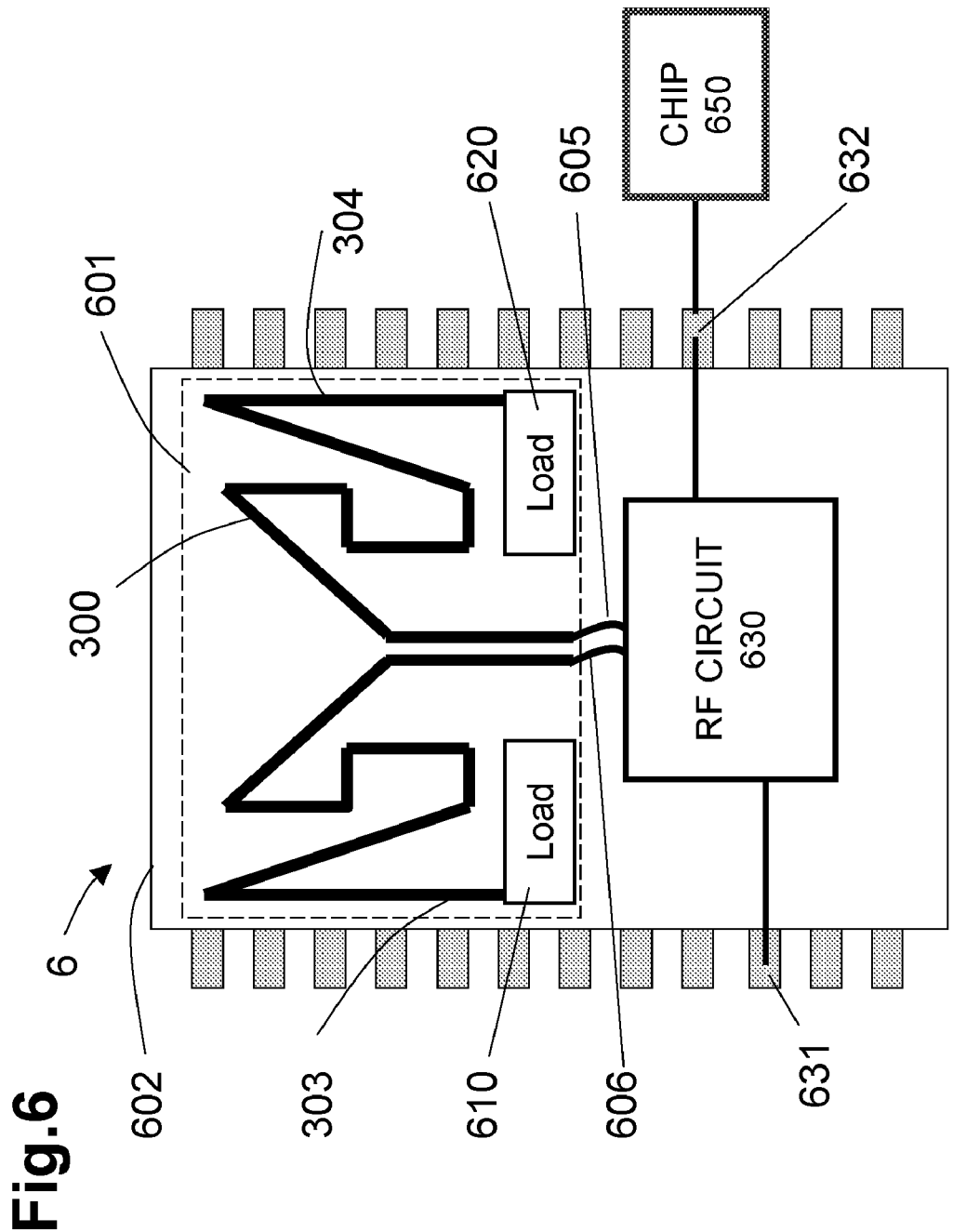
FIG. 6 shows an embodiment of a package including a balanced antenna with a reactive loading.

FIG. 6 shows an embodiment of a package 6 including a balanced antenna 300 with a reactive loading 610 and 620. The antenna 300 has been described in FIG. 3 above. The arm 303 is connected to a load 610 and the arm 304 is connected to a load 620. The antenna 300 is connected via connection 606 (for arm 303) and connection 605 (for arm 304) with an RF circuit 630, which is also attached to the package 6 onto the substrate 602. The RF circuit 630 is connected to a terminal 632 of the package 6 to which also a chip 650 is attached. Furthermore, the RF circuit 630 is connected to a terminal 631.

The reactive loads 610 and/or 620 could be placed at the beginning of the conductive pattern of the antenna or, alternatively, at the end of it. Optionally, the loads 610 and/or 620 can be placed to any intermediate point. Moreover, the reactive loads 610 and/or 620 can be placed outside the package if the necessary connections via terminals of the package 6 are provided.

This scheme of reactive loading is advantageous for further miniaturization purposes of the antenna.

Figure 7:
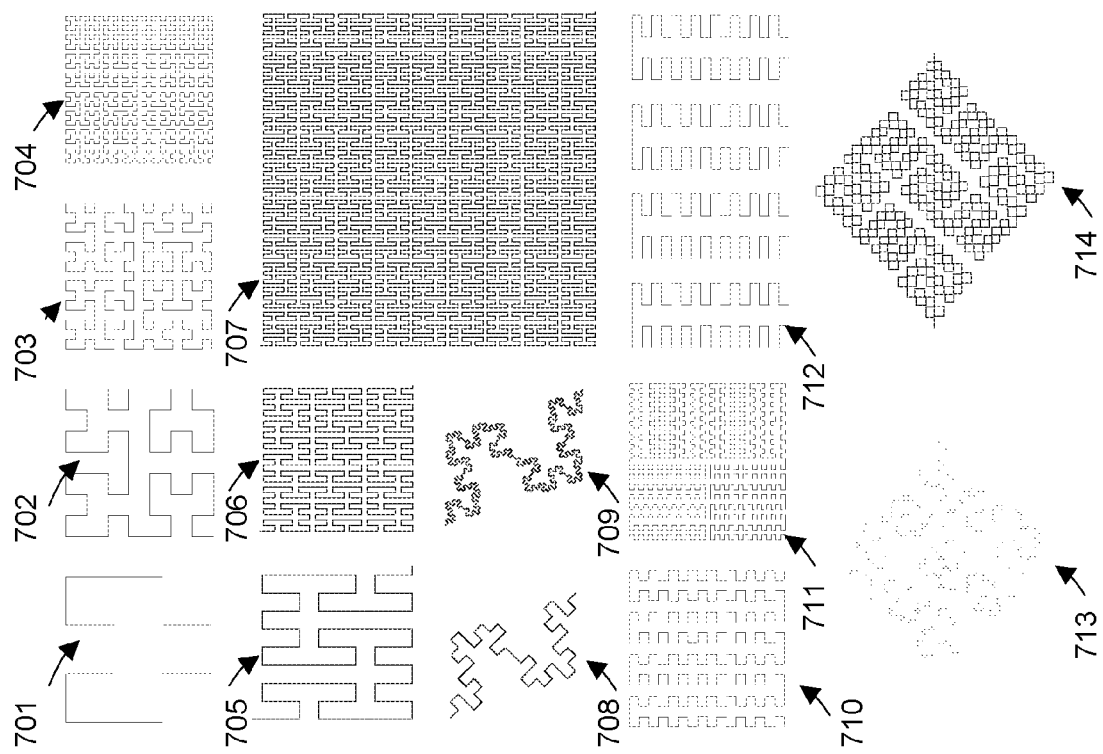
FIG. 7 shows examples of space filling curves.

FIG. 7 shows examples of space filling curves. Filling curves 701 through 714 are examples of prior art space filling curves for antenna designs. Other types of multiband antennas that also feature a reduced size are multilevel antennas as disclosed in WO 01/22528, which herewith is incorporated by reference.

FIG. 8 (FIG. 8A to FIG. 8D) shows an example of how the grid dimension is calculated.

The grid dimension of a curve may be calculated as follows: A first grid having square cells of length L1 is positioned over the geometry of the curve, such that the grid completely covers the curve. The number of cells (N1) in the first grid that enclose at least a portion of the curve are counted. Next, a second grid having square cells of length L2 is similarly positioned to completely cover the geometry of the curve, and the number of cells (N2) in the second grid that enclose at least a portion of the curve are counted. In addition, the first and second grids should be positioned within a minimum rectangular area enclosing the curve, such that no entire row or column on the perimeter of one of the grids fails to enclose at least a portion of the curve. The first grid preferably includes at least twenty-five cells, and the second grid preferably includes four times the number of cells as the first grid. Thus, the length (L2) of each square cell in the second grid should be one-half the length (L1) of each square cell in the first grid. The grid dimension ($D_g$) may then be calculated with the following equation:

$$D_g = -\frac{\log(N2) - \log(N1)}{\log(L2) - \log(L1)}.$$

For the purposes of this application, the term grid dimension curve is used to describe a curve geometry having a grid dimension that is greater than one (1). The larger the grid dimension, the higher the degree of miniaturization that may be achieved by the grid dimension curve in terms of an antenna operating at a specific frequency or wavelength. In addition, a grid dimension curve may, in some cases, also meet the requirements of a space-filling curve, as defined above. Therefore, for the purposes of this application a space-filling curve is one type of grid dimension curve.

Figure 8A:
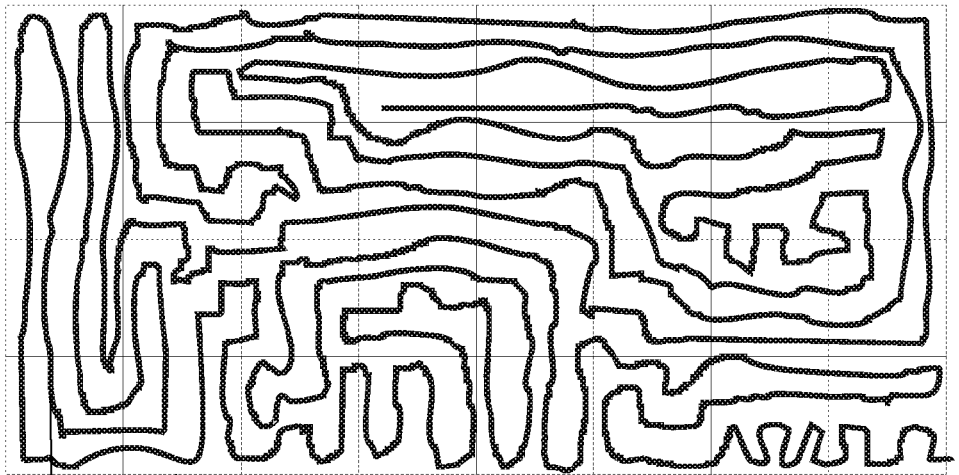
FIG. 8 (FIG. 8A to FIG. 8D) shows an example of how the grid counting dimension is calculated.
Figure 8B:
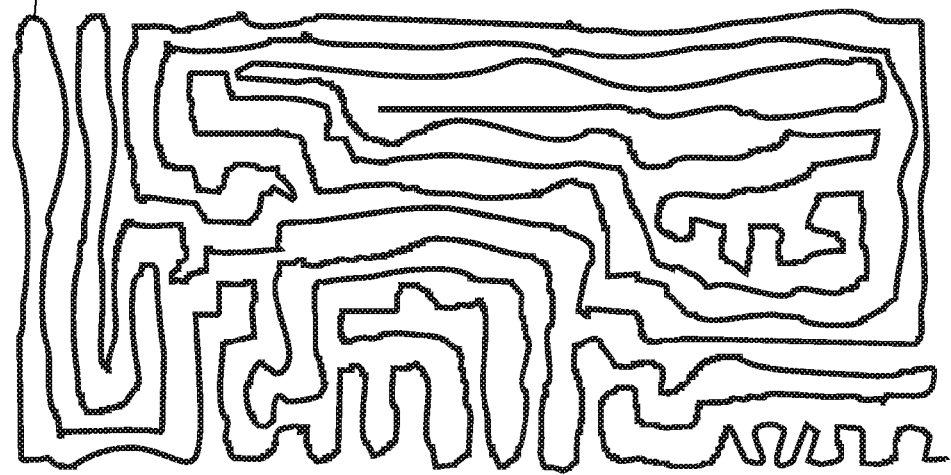

FIG. 8A shows an example two-dimensional antenna 800 forming a grid dimension curve with a grid dimension of approximately two (2). FIG. 8B shows the antenna 800 of FIG. 8A enclosed in a first grid 801 having thirty-two (32) square cells, each with a length L1. FIG. 8C shows the same antenna 800 enclosed in a second grid 802 having one hundred twenty-eight (128) square cells, each with a length L2.

The length (L1) of each square cell in the first grid 801 is twice the length (L2) of each square cell in the second grid 802 (L2=2=L1). An examination of FIG. 8A and FIG. 8B reveal that at least a portion of the antenna 800 is enclosed within every square cell in both the first and second grids 801, 802. Therefore, the value of N1 in the above grid dimension ($D_g$) equation is thirty-two (32) (i.e., the total number of cells in the first grid 801), and the value of N2 is one hundred twenty-eight (128) (i.e., the total number of cells in the second grid 802). Using the above equation, the grid dimension of the antenna 800 may be calculated as follows:

$$D_g = -\frac{\log(128) - \log(32)}{\log(2 \times L1) - \log(L1)} = 2$$

For a more accurate calculation of the grid dimension, the number of square cells may be increased up to a maximum amount. The maximum number of cells in a grid is dependant upon the resolution of the curve. As the number of cells approaches the maximum, the grid dimension calculation becomes more accurate. If a grid having more than the maximum number of cells is selected, however, then the accuracy of the grid dimension calculation begins to decrease. Typically, the maximum number of cells in a grid is one thousand (1000).

Figure 8D:
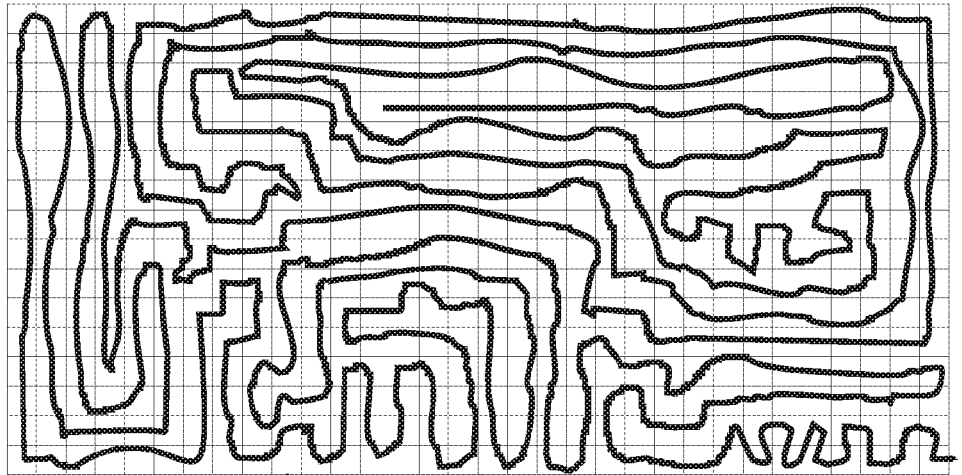
Figure 8C:
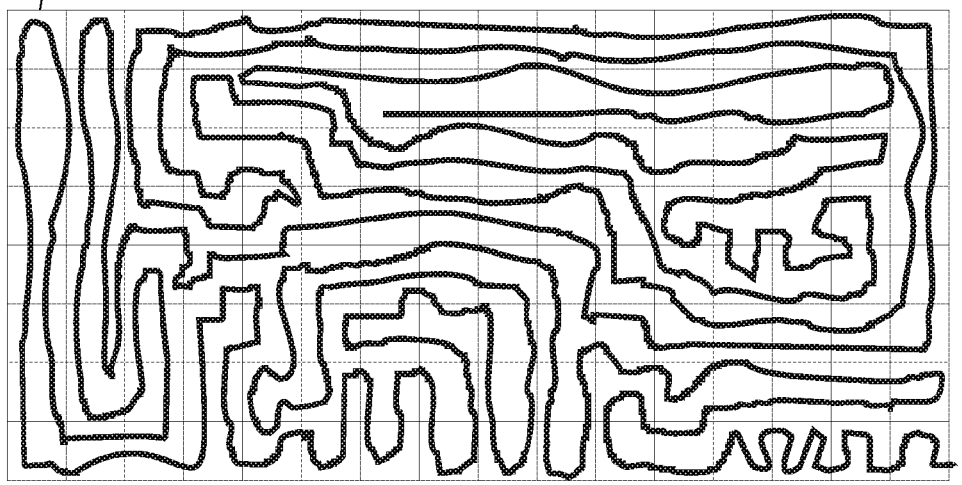

For example, FIG. 8D shows the same antenna 800 enclosed in a third grid 803 with five hundred twelve (512) square cells, each having a length L3. The length (L3) of the cells in the third grid 803 is one half the length (L2) of the cells in the second grid 802, shown in FIG. 8C. As noted above, a portion of the antenna 800 is enclosed within every square cell in the second grid 802, thus the value of N for the second grid 802 is one hundred twenty-eight (128). An examination of FIG. 8D, however, reveals that the antenna 800 is enclosed within only five hundred nine (509) of the five hundred twelve (512) cells of the third grid 803. Therefore, the value of N for the third grid 803 is five hundred nine (509). Using FIG. 8C and FIG. 8D, a more accurate value for the grid dimension ($D_g$) of the antenna 800 may be calculated as follows:

$$D_g = -\frac{\log(509) - \log(128)}{\log(2 \times L2) - \log(L2)} \approx 1.9915$$

Figure 9A:
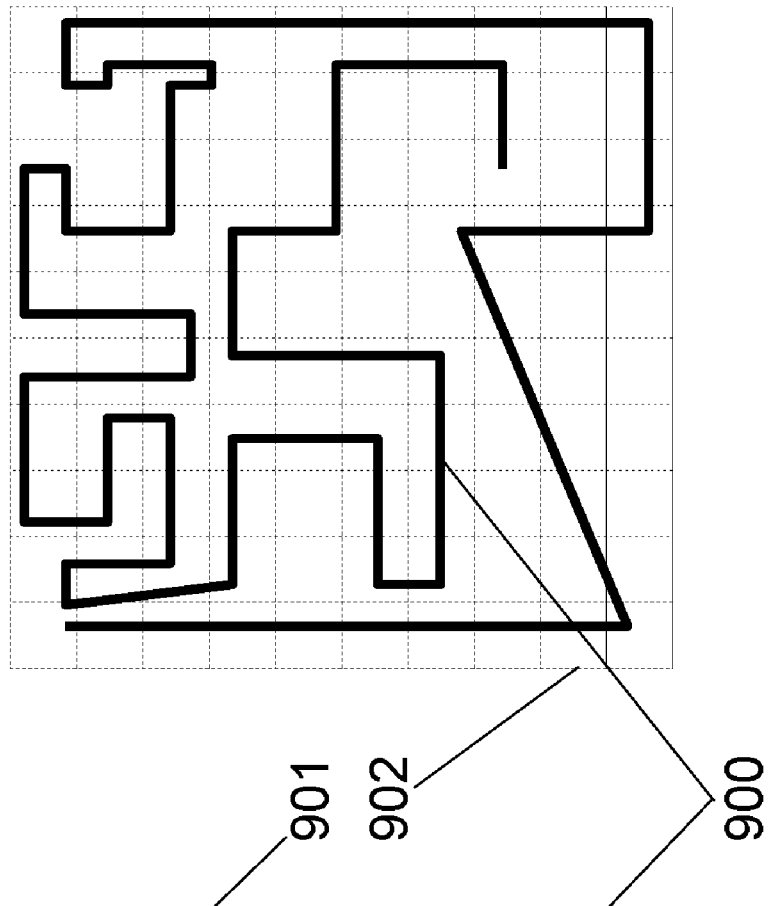
FIG. 9 (FIG. 9A and FIG. 9B) shows an example of how the box counting dimension is calculated.
Figure 9B:
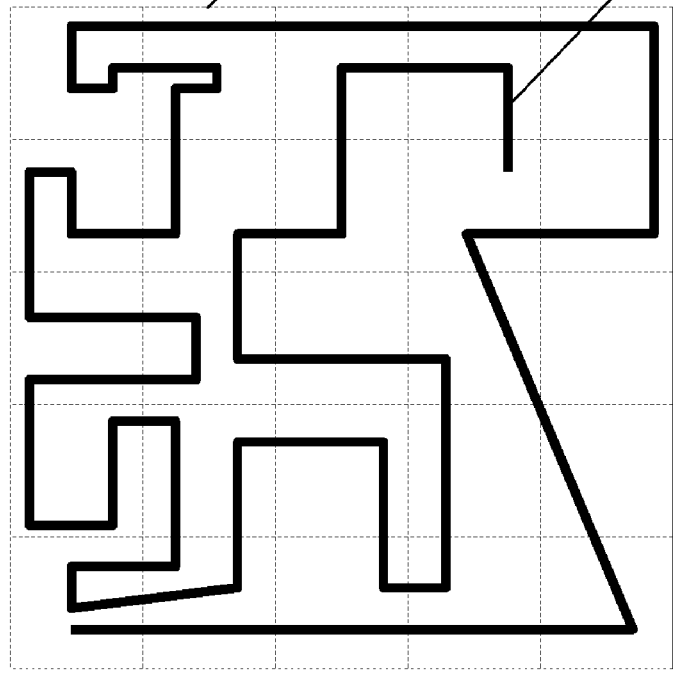

FIG. 9 (FIG. 9A and FIG. 9B) shows an alternative example of how the box counting dimension is calculated.

The antenna comprises a conducting pattern, at least a portion of which includes a curve, and the curve comprises at least five segments, each of the at least five segments forming an angle with each adjacent segment in the curve, at least three of the segments being shorter than one-tenth of the longest free-space operating wavelength of the antenna. Each angle between adjacent segments is less than 180° C. and at least two of the angles between adjacent sections are less than 115° C., and wherein at least two of the angles are not equal. The curve fits inside a rectangular area, the longest side of the rectangular area being shorter than one-fifth of the longest free-space operating wavelength of the antenna.

One of the advantages of the package arrangements of the present invention is that they allow a high package density including the antenna. In some embodiments the antenna can be fitted in a rectangular area, the longest edge of which is shorter than one-twentieth of the longest free-space operating wavelength of the antenna. Alternatively, the arrangement of the package in terms of layout, antenna and chip arrangement allows the whole package to be smaller than one-twentieth of the free-space operating wavelength.

One aspect of the present invention is the box-counting dimension of the curve that forms at least a portion of the antenna. For a given geometry lying on a surface, the box-counting dimension is computed in the following way: First a grid with boxes of size L1 is placed over the geometry, such that the grid completely covers the geometry, and the number of boxes N1 that include at least a point of the geometry are counted; secondly a grid with boxes of size L2 (L2 being smaller than L1) is also placed over the geometry, such that the grid completely covers the geometry, and the number of boxes N2 that include at least a point of the geometry are counted again. The box-counting dimension D is then computed as:

$$D = -\frac{\log(N2) - \log(N1)}{\log(L2) - \log(L1)}$$

In terms of the present invention, the box-counting dimension is computed by placing the first and second grids inside the minimum rectangular area enclosing the curve of the antenna and applying the above algorithm.

The first grid should be chosen such that the rectangular area is meshed in an array of at least 5×5 boxes or cells, and the second grid is chosen such that L2=½L and such that the second grid includes at least 10×10 boxes. By the minimum rectangular area it will be understood such area wherein there is not an entire row or column on the perimeter of the grid that does not contain any piece of the curve. Thus, some of the embodiments of the present invention will feature a box-counting dimension larger than 1.17, and in those applications where the required degree of miniaturization is higher, the designs will feature a box-counting dimension ranging from 1.5 up to 3, inclusive. For some embodiments, a curve having a box-counting dimension of about 2 is preferred. For very small antennas, that fit for example in a rectangle of maximum size equal to one-twentieth of the longest free-space operating wavelength of the antenna, the box-counting dimension will be necessarily computed with a finer grid. In those cases, the first grid will be taken as a mesh of 10×10 equal cells, while the second grid will be taken as a mesh of 20×20 equal cells, and then D is computed according to the equation above. In the case of small packages with of planar designs, i.e., designs where the antenna is arranged in a single layer on a package substrate, it is preferred that the dimension of the curve included in the antenna geometry have a value close to D=2.

In general, for a given resonant frequency of the antenna, the larger the box-counting dimension the higher the degree of miniaturization that will be achieved by the antenna. One way of enhancing the miniaturization capabilities of the antenna according to the present invention is to arrange the several segments of the curve of the antenna pattern in such a way that the curve intersects at least one point of at least 14 boxes of the first grid with 5×5 boxes or cells enclosing the curve. Also, in other embodiments where a high degree of miniaturization is required, the curve crosses at least one of the boxes twice within the 5×5 grid, that is, the curve includes two non-adjacent portions inside at least one of the cells or boxes of the grid.

An example of how the box-counting dimension is computed according to the present invention is shown in FIG. 9A and FIG. 9B. An example of a curve 900 according to the present invention is placed under a 5×5 grid 901 and under a 10×10 grid 902. As seen in the graph, the curve 900 touches N1=25 boxes in grid 901 while it touches N2=78 boxes in grid 902. In this case the size of the boxes in grid 901 is twice the size of the boxes in 902. By applying the equation above it is found that the box-counting dimension of curve 902 is, according to the present invention, equal to D=1.6415. This example also meets some other characteristic aspects of some preferred embodiments within the present invention. The curve 900 crosses more than 14 of the 25 boxes in grid 901, and also the curve crosses at least one box twice, that is, at least one box contains two non adjacent segments of the curve. In fact, 900 is an example where such a double crossing occurs in 13 boxes out of the 25 in 901.

The package arrangements in which the antenna is built on a single layer of a package substrate are very convenient in terms of cost because a single mask can be used for processing the antenna pattern on such a layer. In some embodiments the antenna is arranged in a single layer and fed in one tip of the curve, such that no conductor crossing over the curve is required. Although not required, a further simplification and cost reduction is achieved by means of those embodiments in the present invention wherein the antenna and the chip are mounted on the same layer of a package substrate.

It is noted that, according to the present invention, the antenna structure is not limited to a planar structure, because the package can include several portions or parts of the antenna in multiple layers or components of the package.

In the case of non-planar, multi-layer or volumetric structures for the antenna pattern within the package, the box-counting algorithm can be computed by means of a three-dimensional grid, using parallelepiped cells instead of rectangular and meshes with 5×5×5 cells and 10×10×10 or 20×20×20 cells, respectively. In those cases, such a curve can take a dimension larger than two and in some cases, up to three.

Figure 10:
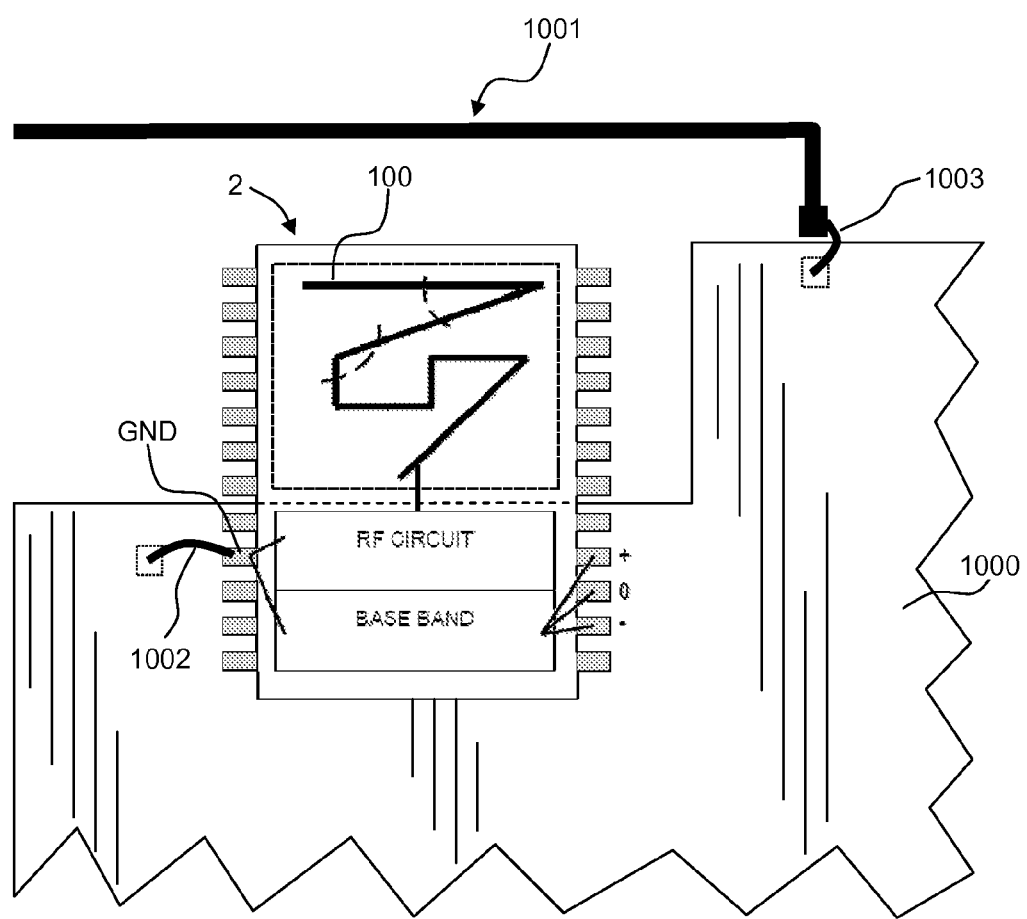
FIG. 10 shows an embodiment of a package including an antenna and a circuit.

FIG. 10 shows an alternative embodiment of the package 2, which has already been described in FIG. 2, mounted on a ground plane 1000. In the figure, it is only represented a portion of the ground plane 1000 in the vicinity of the package 2.

The ground connector GND of the package 2 is connected to the ground plane 1000 by means of connection 1002. The ground plane 1000 is located with respect to the package 2 so as not to be underneath or above the at least one antenna 100.

In this embodiment the antenna 100 comprises a parasitic element 1001 that is located outside the package 2. The parasitic element 1001 is also connected to the ground plane 1000 by means of connection 1003.

Figure 11:
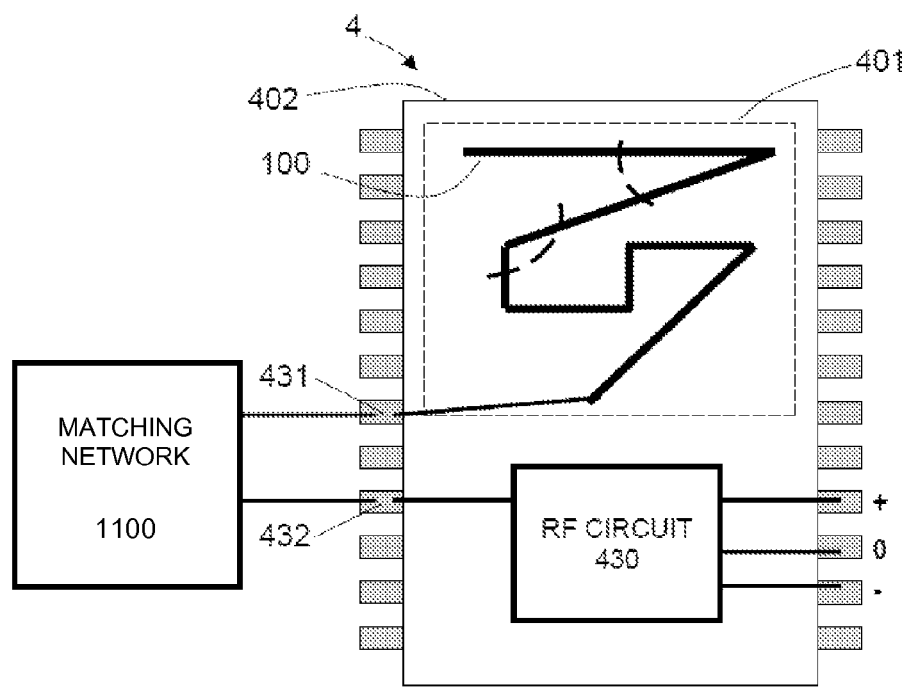
FIG. 11 shows an embodiment of a package with a matching network.

FIG. 11 shows an alternative embodiment of the package 4 of FIG. 4, in which the radio-frequency component 450 outside the package 4 is a matching network 1100.

Figure 12:
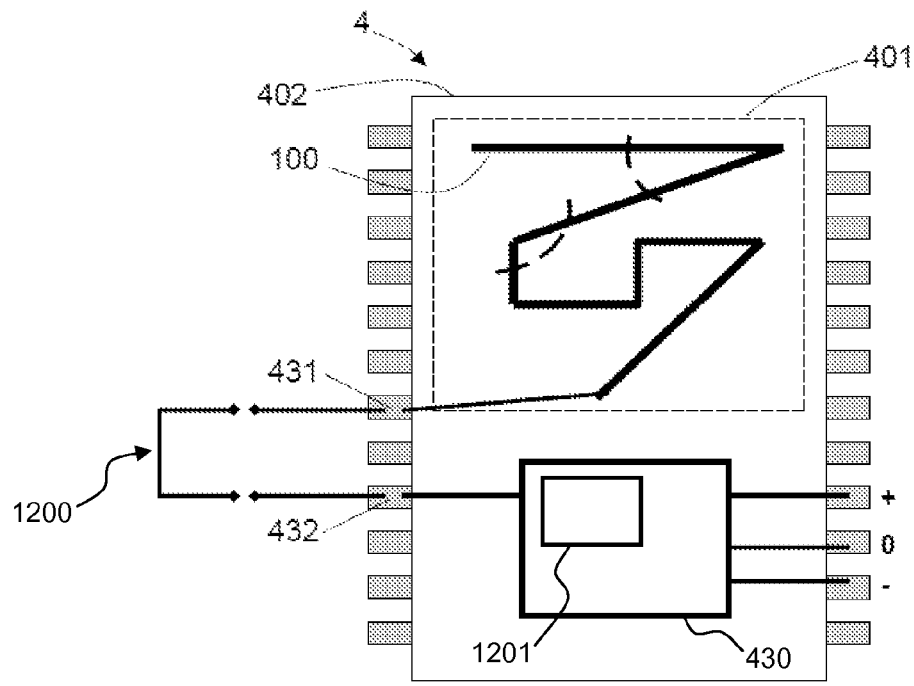
FIG. 12 shows an embodiment of a package with radio-frequency component outside the package.

FIG. 12 shows another embodiment of the package 4 of FIG. 4, in which the radio-frequency component 450 outside the package 4 is a bypass or through-connection 1200. Furthermore, in this embodiment the RF circuit 430 comprises a filter 1201.

Figure 13:
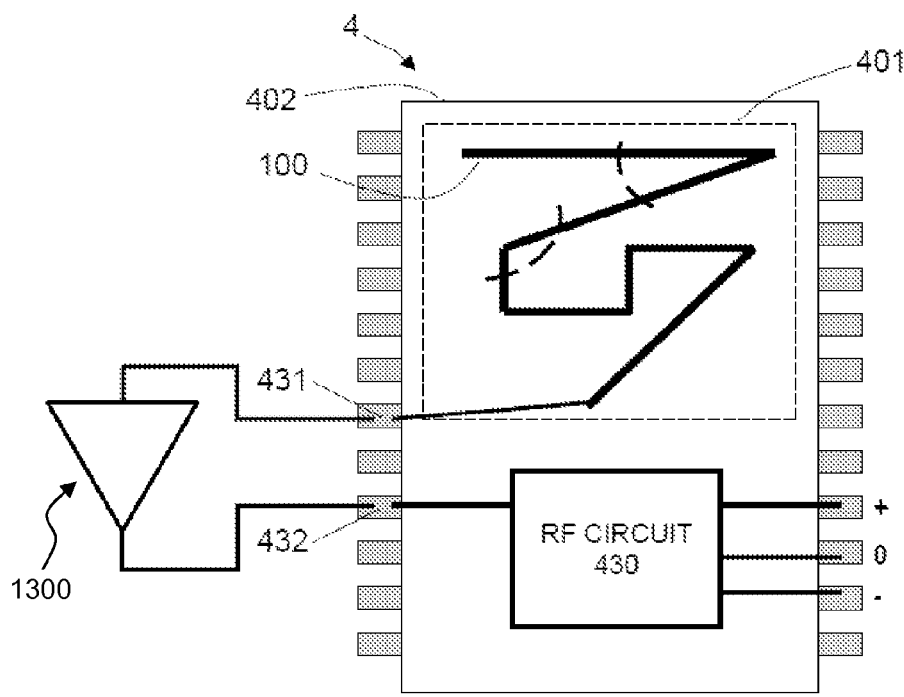
FIG. 13 shows an embodiment of a package with a power amplifier.

FIG. 13 shows a further embodiment of the package 4 of FIG. 4, in which the radio-frequency component 450 outside the package 4 comprises a power amplifier 1300.

Figure 14:
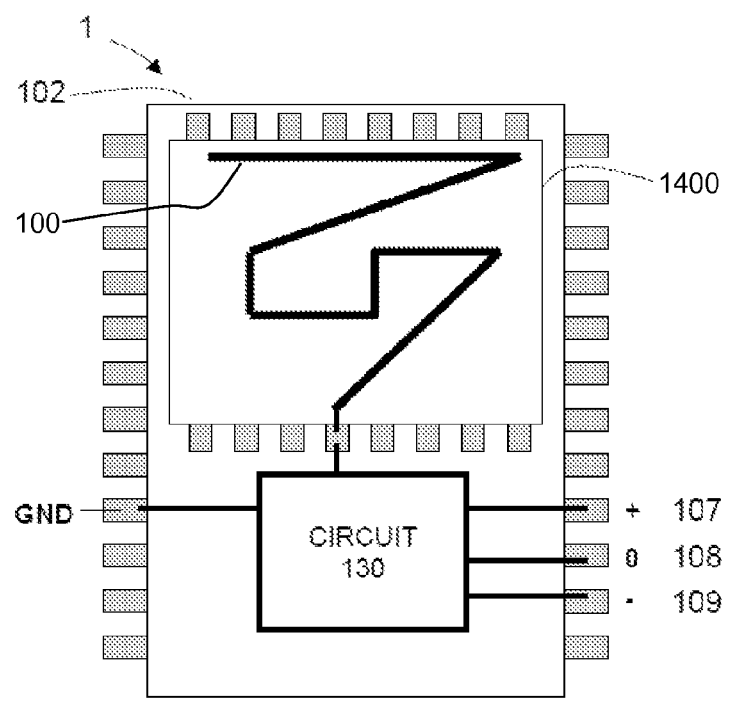
FIG. 14 shows an embodiment of a package with an antenna and a circuit.

FIG. 14 shows an alternative embodiment of the package 1 of FIG. 1, in which the antenna 100 is a modular or discrete component 1400. In particular, said modular or discrete component 1400 is a surface mount technique (SMT) component.

Figure 15:
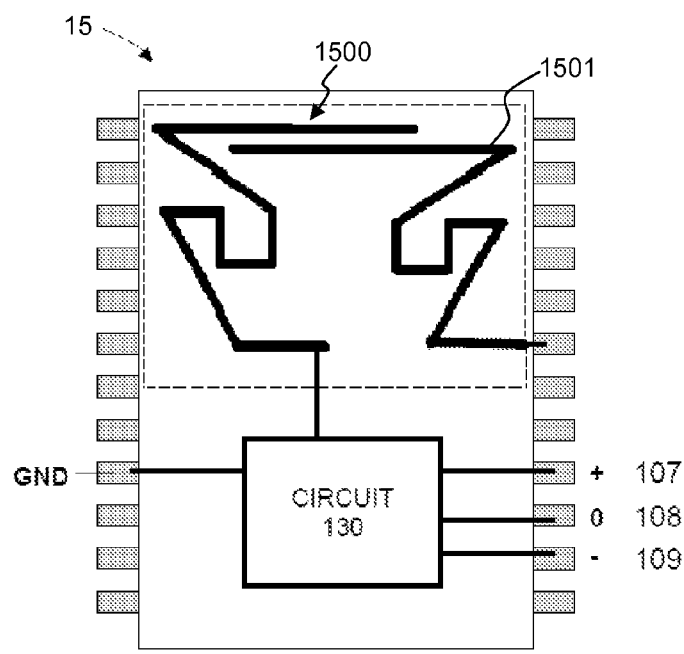
FIG. 15 shows an embodiment of a package including an antenna, a circuit, and a parasitic element.

FIG. 15 shows an embodiment of a package 15 similar to the one already described in connection with FIG. 1, but in which an antenna 1500 has a parasitic element 1501 located inside the package 15.

Figure 16:
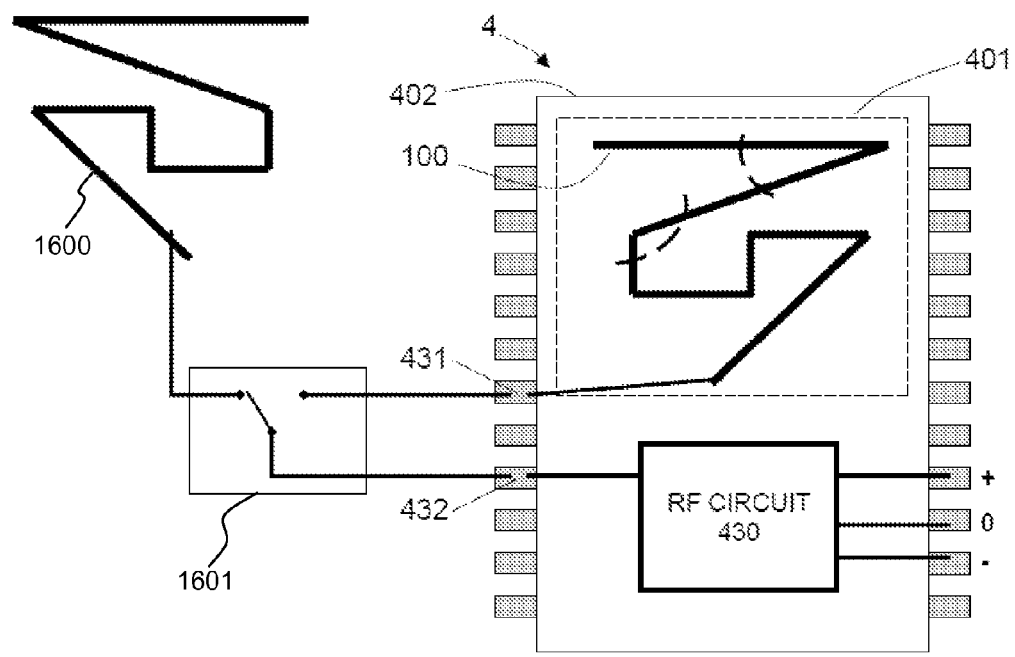
FIG. 16 shows an embodiment of a package with a second antenna external to the package.

FIG. 16 shows an embodiment of a system comprising the package 4 of FIG. 4 and a second antenna 1600 external to the package 4. The radio-frequency component 450 outside the package 4 comprises a switch 1601 that makes it possible to commute between the antenna 100 arranged in the package 4 and the second antenna 1600, providing antenna diversity.

Figure 17A:
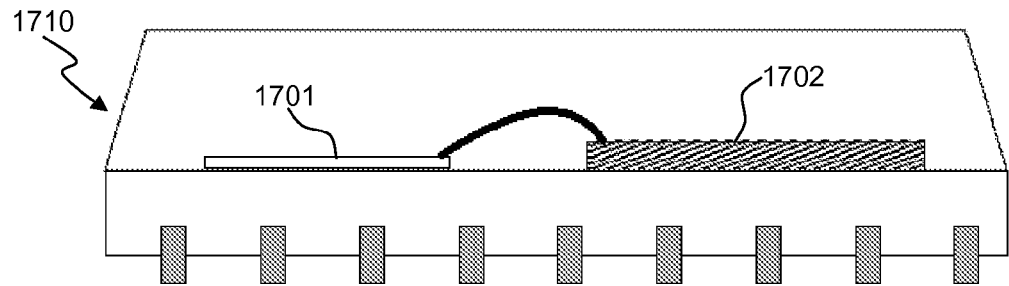
FIGS. 17A to 17C show embodiments of a system with an antenna and an electrical circuit enclosed in a common package housing.

FIG. 17A shows an embodiment of a system comprising an antenna 1701 and an electrical circuit 1702 enclosed in a common package housing 1710 having a form factor of an in-line package for integrated circuit packages.

Figure 17B:
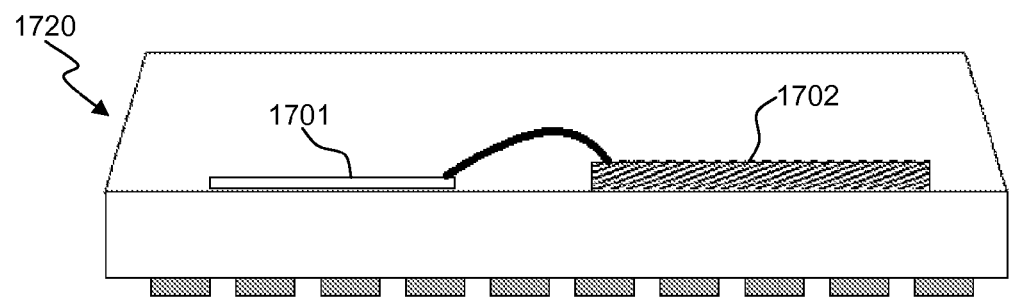

FIG. 17B shows an embodiment of a system comprising an antenna 1701 and an electrical circuit 1702 enclosed in a common package housing 1720 having a form factor of a surface mount package for integrated circuit packages.

Figure 17C:
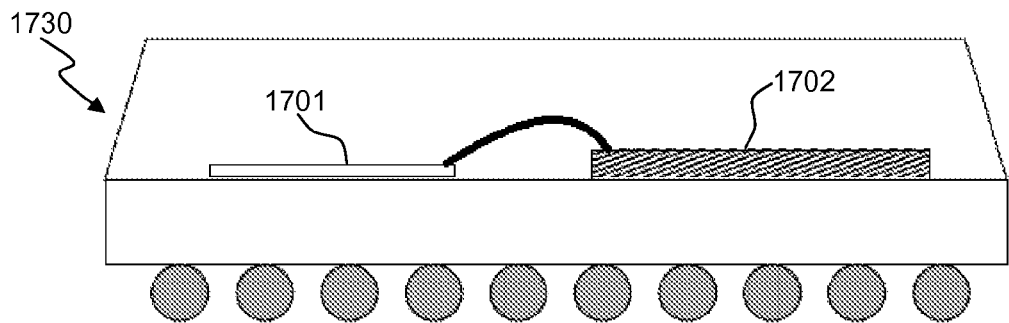

FIG. 17C shows an embodiment of a system comprising an antenna 1701 and an electrical circuit 1702 enclosed in a common package housing 1730 having a form factor of a ball grid array package for integrated circuit packages.

Figure 18:
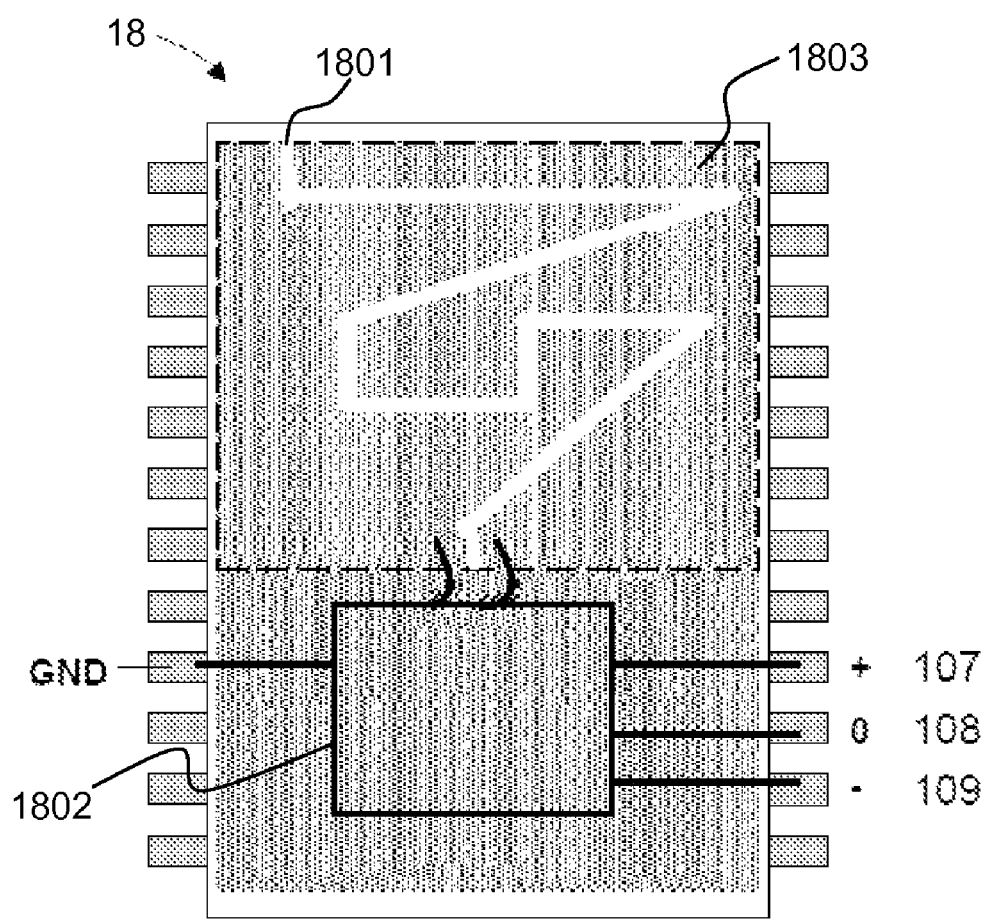
FIG. 18 shows an embodiment of a system with an antenna and an electrical circuit enclosed in a common package housing.

FIG. 18 shows an embodiment of a system comprising an antenna 1801 and an electrical circuit 1802 enclosed in a common package housing 18 having a form factor of a lead-frame package for integrated circuit packages. The package housing 18 comprises a metal layer 1803 on which the antenna 1801 has been created and on which the electrical circuit 1802 is mounted.

Figure 19A:
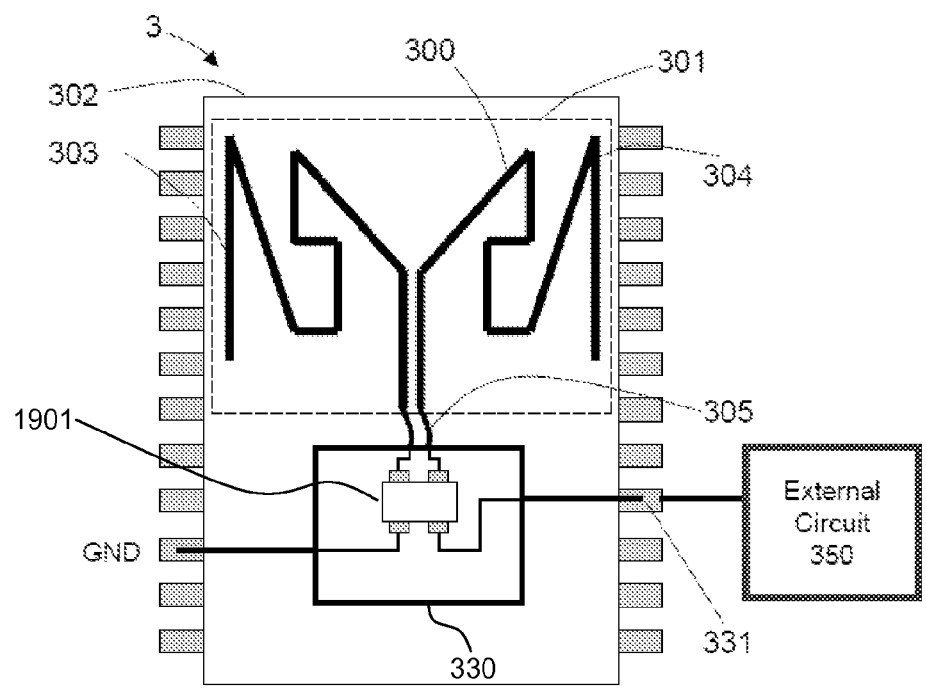
FIGS. 19A and 19B show embodiments of a package with a balun.

FIG. 19A shows an alternative embodiment of the package 3 of FIG. 3, in which the radio-frequency circuit 330 comprises a balun 1901, the balun 1901 being a discrete component.

Figure 19B:
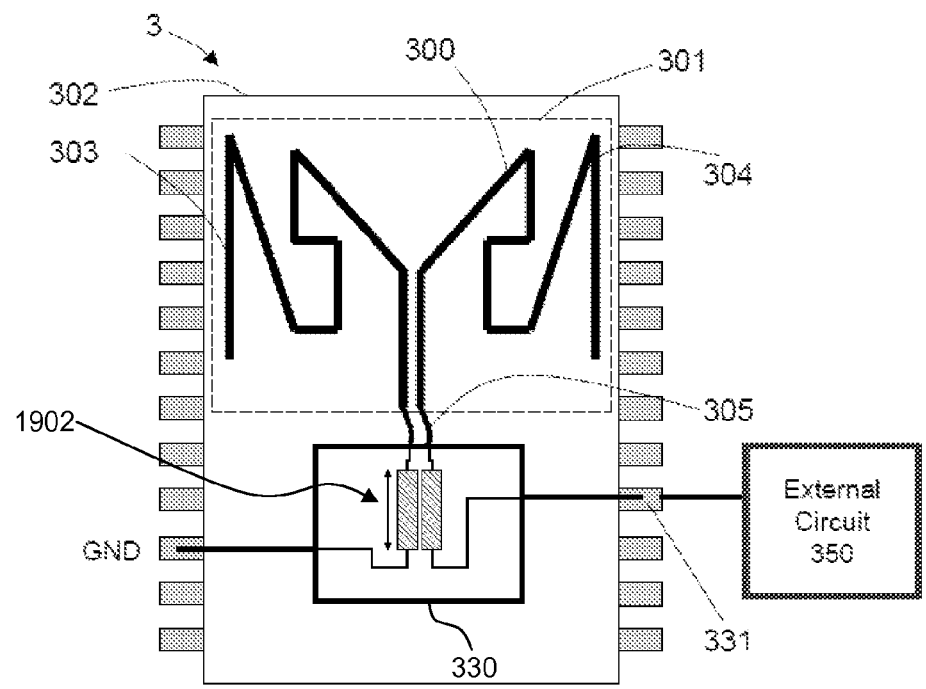

FIG. 19B shows a further embodiment of the package 3 of FIG. 3, in which the radio-frequency circuit 330 comprises a balun 1902, the balun 1902 being a printed circuit.

Figure 20:
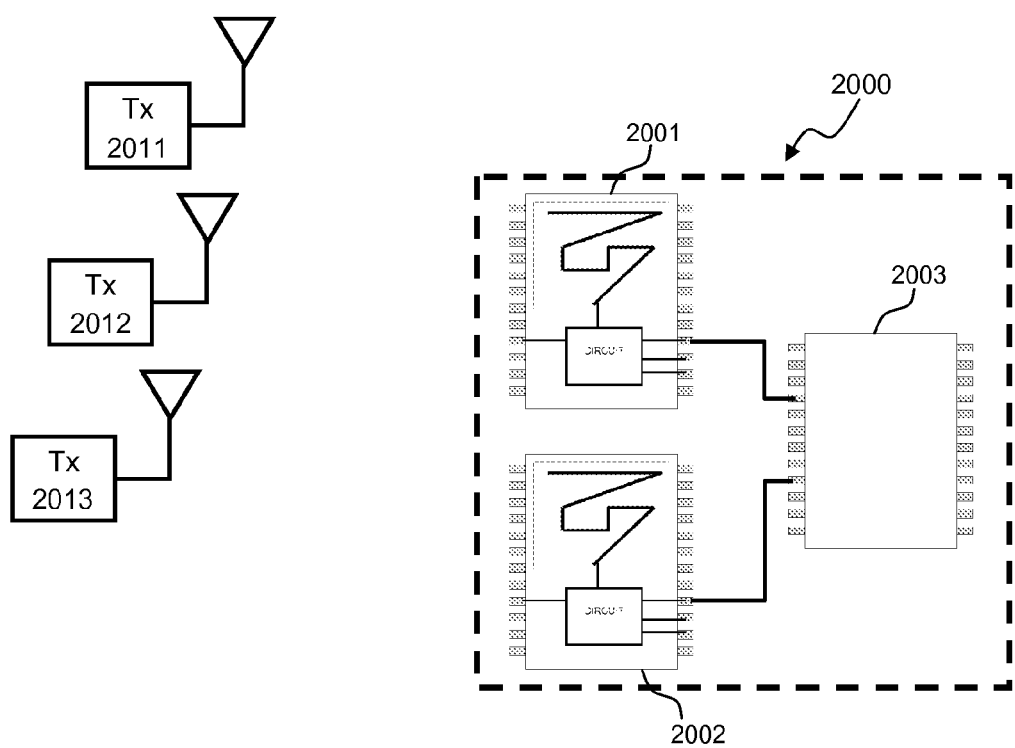
FIG. 20 shows an embodiment of a multiple-antenna communication system that forms a MIMO system.

FIG. 20 shows an embodiment of multiple-antenna communication system 2000 that forms a multiple-input-multiple-output (MIMO) system. The multiple-antenna communication system 2000 comprises two packages 2001 and 2002 (such as the one in FIG. 1) mutually connected through a control circuit 2003. The MIMO system 2000 receives signals from three remote transmitters (2011, 2012 and 2013)

Figure 21:
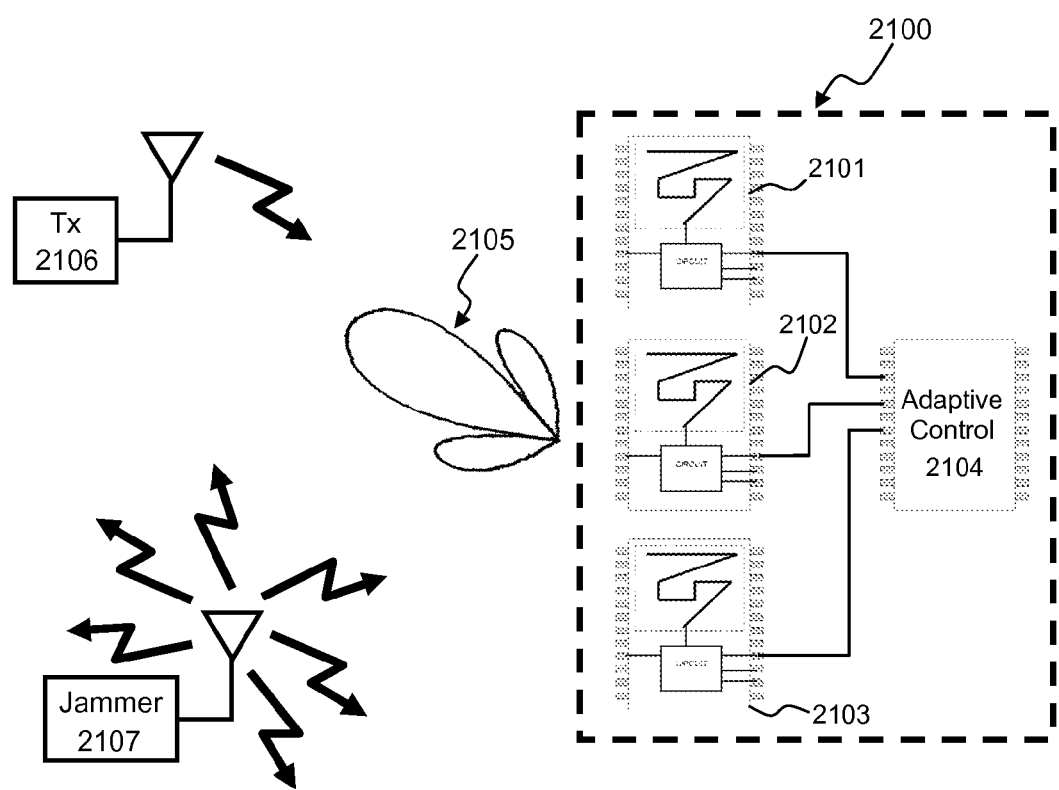
FIG. 21 shows an embodiment of a multiple-antenna communication system that forms a smart antenna system.

FIG. 21 shows an embodiment of multiple-antenna communication system 2100 that forms a smart antenna system. The multiple-antenna communication system 2100 comprises three packages 2101, 2102 and 2103 (such as the one in FIG. 1) mutually connected through an adaptive control circuit 2104. The adaptive control circuit 2104 combines the radiation patterns of the antennas included in the packages 2101-2103 so that a resulting radiation pattern 2105 can be selectively directed towards a remote transmitter 2106 and away from a jamming source 2107 optimizing the signal-to-interference ratio of the system.

Figure 22:
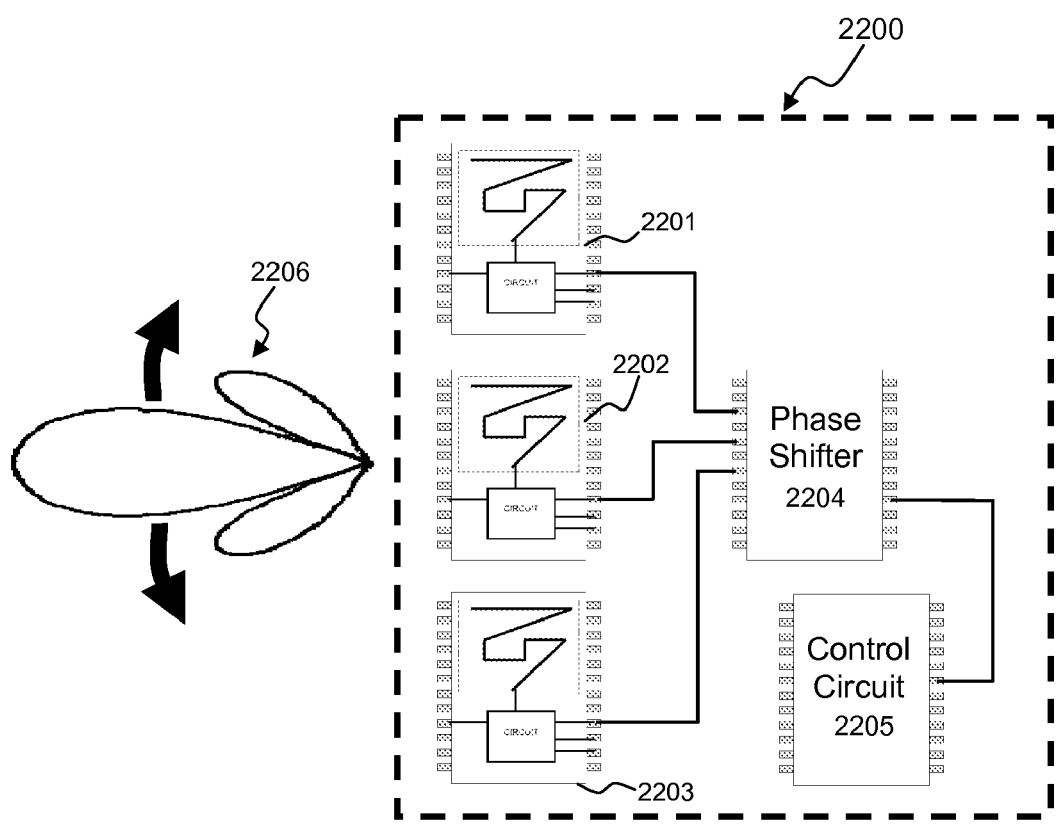
FIG. 22 shows an embodiment of a multiple-antenna communication system that forms a phased array system.

FIG. 22 shows an embodiment of multiple-antenna communication system 2200 that forms a phased array system. The multiple-antenna communication system 2200 comprises three packages 2201, 2202 and 2203 (such as the one in FIG. 1) mutually connected through a phase shifter 2204. The antennas included in the packages 2201-2203 form an array, each antenna being fed with a phase determined by the phase shifter 2204. By modifying the phases applied to the antennas, the tilt angle of the radiation pattern 2206 of the array can be varied. The multiple-antenna communication system 2200 further comprises a control circuit 2205 to determine the sequence in which the phases are varied to define a scanning path.

Figure 23:
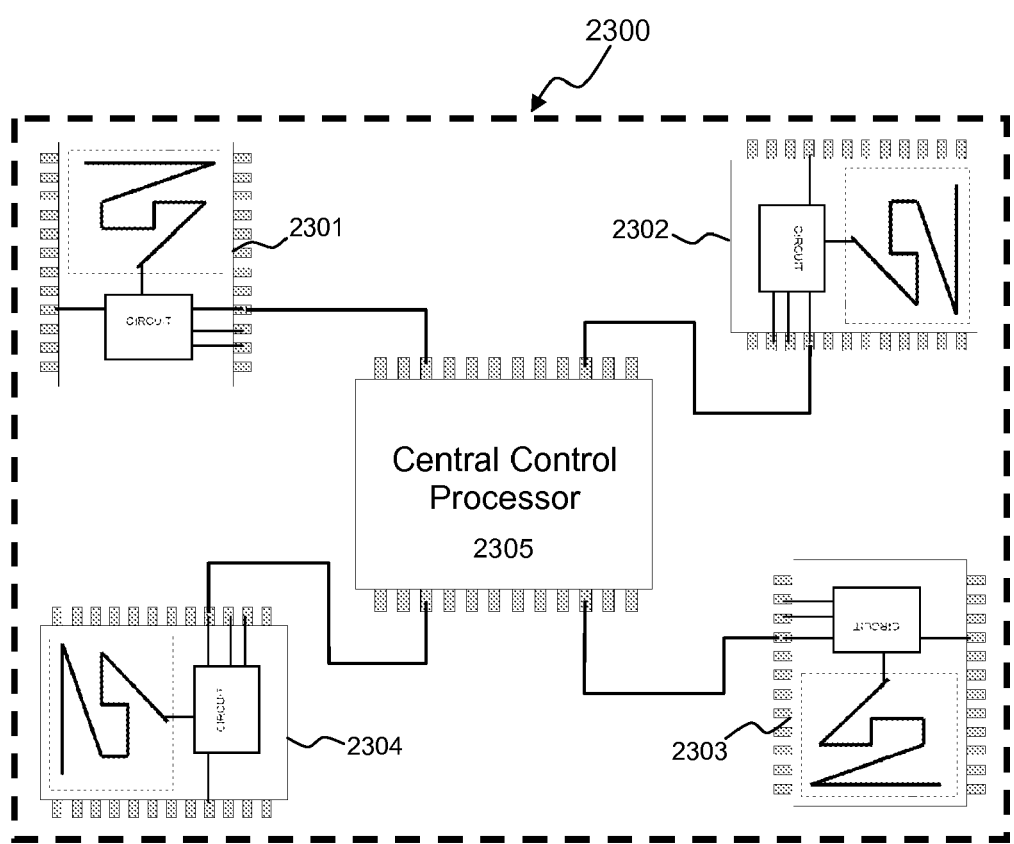
FIG. 23 shows an embodiment of a multiple-antenna communication system that forms a sensor network.

FIG. 23 shows an embodiment of multiple-antenna communication system 2300 that forms a sensor network. The multiple-antenna communication system 2300 comprises four packages 2301, 2302, 2303 and 2304 (such as the one in FIG. 1) mutually connected through a central control processor 2305.

The invention claimed is:

1. System comprising:
   an antenna and
   an electrical circuit,
   wherein the antenna and the electrical circuit are arranged in an integrated circuit package,
   wherein the antenna comprises a conducting pattern, at least a portion of which includes a curve comprising at least five segments, each of said at least five segments forming a pair of angles with a respective adjacent segment in said curve, at least three of said segments being shorter than one-tenth of the longest free-space operating wavelength of said antenna, and
   wherein said conducting pattern fits inside a rectangular area of the package, a longest side of said rectangular area being shorter than one-fifth of a longest free-space operating wavelength of said antenna.

2. System of claim 1,
   wherein the electrical circuit performs a base-band functionality.

3. System of claim 1,
   wherein the electrical circuit performs a digital functionality.

4. System according to claim 1, wherein the electrical circuit comprises a radio-frequency circuit.

5. System according to claim 4, wherein a coupling between the antenna and the radio-frequency circuit is a reactive coupling.

6. System according to claim 4, wherein the system comprises a ground plane, and wherein the radio-frequency circuit is connected to the ground plane.

7. System according to claim 6, wherein the ground plane is located with respect to the package so as not to be underneath or above the antenna.

8. System according to claim 4, wherein at least some of the connections of the radio-frequency circuit are balanced.

9. System according to claim 4, wherein the system comprises a radio-frequency component outside the package, and wherein the antenna is connected to the radio-frequency circuit and at least a part of the radio-frequency circuit is connected to the radio-frequency component outside the package.

10. System according to claim 4, wherein the system comprises a radio-frequency component outside the package, and wherein the antenna is connected to the radio-frequency component outside the package.

11. System according to claim 4, wherein the radio-frequency circuit comprises a balun.

12. System according to claim 11, wherein the balun is a printed circuit.

13. System according to claim 11, wherein the balun is a discrete component.

14. System according to claim 4, wherein the package comprises a radio-frequency input/output connector, and wherein at least one of the antenna and the radio-frequency circuit comprises a connection with the radio-frequency input/output connector.

15. System according to claim 4, wherein the system comprises a radio-frequency component outside the package and wherein at least one of the radio-frequency circuit and the radio-frequency component outside the package includes at least one filter.

16. System according to claim 1, comprising a radio-frequency component outside the package.

17. System according to claim 16, wherein the radio-frequency component outside the package is a matching network.

18. System according to claim 16, wherein radio-frequency component outside the package is at least one of a bypass or a through-connection.

19. System according to claim 16, wherein the radio-frequency component outside the package comprises a power amplifier.

20. System according to claim 1, wherein the antenna is connected to an input/output connector of the package and at least a part of the electrical circuit is connected to the input/output connector of the package.

21. System according to claim 1, wherein the antenna is a space filling antenna.

22. System according to claim 21, wherein the space-filling antenna has a dimension larger than 1 when computed as a grid dimension calculation.

23. System according to claim 21, wherein the space-filling antenna has a dimension larger than 1 when computed as a box counting dimension calculation.

24. System according to claim 1, wherein, for each pair of angles, the smaller angle of the pair is less than 180° and at least two of said smaller angles are less than 115°, wherein at least two of the angles, which are on the same side of the curve and are formed from adjacent segments of the group of said at least five segments, are different.

25. System according to claim 24, wherein at least two of the angles, which are on the same side of the curve and are formed from adjacent segments of the group of said at least five segments, are different.

26. System according to claim 1, wherein the antenna is a modular or a discrete component.

27. System according to claim 26, wherein the modular or discrete component is a surface mount technique (SMT) component.

28. System according to claim 1, wherein the antenna comprises two ends, and wherein both ends of the antenna are connected to the package.

29. System according to claim 28, wherein at least one end of the two ends of the antenna is connected to an input/output connector of the package.

30. System according to claim 28, wherein both ends of the antenna are connected to input/output connectors of the package.

31. System according to claim 1, wherein the antenna has a parasitic element.

32. System according to claim 31, wherein the parasitic element is inside the package.

33. System according to claim 31, wherein the parasitic element is outside the package.

34. System according to claim 1, comprising a second antenna external to the package.

35. System according to claim 34, wherein the system comprises a switch that commutes between the antenna and the second antenna.

36. System according to claim 35, wherein the switch is provided outside the package.

37. System according to claim 35, wherein the switch is provided on the package.

38. System according to claim 35, wherein the switch that commutes between the antenna and the second antenna provides an antenna diversity system.

39. System according to claim 1, wherein the antenna is disabled.

40. System according to claim 1, wherein the antenna is a balanced antenna.

41. System according to claim 1, wherein the antenna is an unbalanced antenna.

42. System according to claim 1, wherein the antenna is loaded with discrete reactive components.

43. System according to claim 42, wherein the antenna is loaded with external loads.

44. Multiple-antenna communication system comprising a plurality of mutually connected systems,
wherein each system of the plurality of mutually connected systems comprises: an antenna and an electrical circuit, wherein the antenna and the electrical circuit are arranged in an integrated circuit package,
wherein the antenna comprises a conducting pattern, at least a portion of which includes a curve comprising at least five segments, each of said at least five segments forming a pair of angles with a respective adjacent segment in said curve, at least three of said segments being shorter than one-tenth of the longest free-space operating wavelength of said antenna, and
wherein said conducting pattern fits inside a rectangular area of the package, a longest side of said rectangular area being shorter than one-fifth of a longest free-space operating wavelength of said antenna.

45. System according to claim 44, wherein the multiple antenna communication system is one of a multiple-input-multiple-output system, a smart antenna system, a phased array system and a sensor network.

46. A system, comprising:
an antenna formed on a substrate, the antenna comprising a multi-segment conductor provided in a space-filling pattern, at least a portion of which including a curve comprising at least five segments, each of said at least five segments forming a pair of angles with a respective adjacent segment in said curve, at least three of said segments being shorter than one-tenth of the longest free-space operating wavelength of the antenna, the antenna occupying a rectangular area of the substrate in which a longest side of the rectangular area is shorter than ⅕ of a longest free space operating wavelength of the antenna, and
a circuit also provided on the substrate,
wherein the antenna and the circuit are enclosed in a common package housing.

47. The system of claim 46, wherein the package housing is an integrated circuit package.

48. The system of claim 47, wherein the package housing is a surface mount package.

49. The system of claim 47, wherein the package housing is a ball grid array package.

50. The system of claim 47, wherein the package housing is an in-line package.

51. The system of claim 47, wherein the package housing is a leadframe package.

52. System comprising: at least one antenna and an electrical circuit, wherein the electrical circuit comprises a radio-frequency circuit,
wherein the at least one antenna and the electrical circuit are arranged in a package, said package being an integrated circuit package,
wherein the system further comprises a radio-frequency component outside the package, and
wherein the at least one antenna is connected to the radio-frequency component outside the package.

* * * * *